(12) United States Patent
Mao et al.

(10) Patent No.: US 12,336,153 B2
(45) Date of Patent: Jun. 17, 2025

(54) TWO-PHASE IMMERSION COOLING APPARATUS

(71) Applicant: Cooler Master Co., Ltd., Taipei (TW)

(72) Inventors: Deming Mao, Taipei (TW); Sy chi Kuo, Taipei (TW); Hsiang chieh Tseng, Taipei (TW)

(73) Assignee: Cooler Master Co., Ltd., Taipei (TW)

( * ) Notice: Subject to any disclaimer, the term of this patent is extended or adjusted under 35 U.S.C. 154(b) by 295 days.

(21) Appl. No.: 17/897,214

(22) Filed: Aug. 28, 2022

(65) Prior Publication Data

US 2024/0074120 A1 Feb. 29, 2024

(51) Int. Cl.
*H05K 7/20* (2006.01)
(52) U.S. Cl.
CPC ......... *H05K 7/20818* (2013.01); *H05K 7/203* (2013.01); *H05K 7/20318* (2013.01); *H05K 7/20327* (2013.01)
(58) Field of Classification Search
CPC .................................................. H05K 7/00
See application file for complete search history.

(56) References Cited

U.S. PATENT DOCUMENTS

| 10,350,526 | B2 * | 7/2019 | Paoluccio | ............ C10M 175/00 |
| 11,744,041 | B2 * | 8/2023 | Smith | ................ H05K 7/20327 361/699 |
| 2016/0215913 | A1 * | 7/2016 | Knoener | ................. H01F 27/14 |

* cited by examiner

*Primary Examiner* — Jerry Wu
(74) *Attorney, Agent, or Firm* — Merchant & Gould P.C.

(57) ABSTRACT

A two-phase immersion cooling apparatus including a coolant tank, at least one condenser, a heat transfer enhancer, and at least one heat dissipating component is provided. Vapor and liquid regions are formed in the coolant tank. Pressure enhanced and boiling regions are formed in the heat transfer enhancer. Accelerated flow and at least one recycling flow region are formed between the heat transfer enhancer and coolant tank. The at least one condenser is in thermal communication with the vapor region. The pressure enhanced and boiling regions and accelerated flow and at least one recycling flow region, are in fluid communication thereamong. A temperature and pressure within the pressure enhanced and boiling regions is greater than that within the at least one recycling flow region, maximizing heat absorption and enhancing vapor bubble nucleation, and accelerating fluid circulation from the at least one recycling flow region to the boiling region.

20 Claims, 18 Drawing Sheets

TWO-PHASE IMMERSION COOLING APPARATUS

TECHNICAL FIELD

Example embodiments relate generally to the field of heat dissipation using fluid and, more particularly, to two-phase immersion cooling apparatus' recycling cooling fluid that dissipates heat generated by electronic components.

BACKGROUND

With the increase of the processing speed and performance of integrated circuit (IC) chips, such as central processing units (CPUs), graphic processing units (GPUs), field programmable gate arrays (FPGAs), and application specific ICs (ASICs), and the modules containing the chips, and the systems containing the modules, such as server systems, the amount of heat generated during operation of the chips, modules, and systems increases. The heat generation increases the temperature of the chips, modules, and systems, and, if the heat cannot be dissipated effectively, reliability and performance of the chips, modules, and systems are reduced.

In server applications, processors along with their associated electronics (e.g., memory, disk drives, power supplies, etc.) are packaged in removable node configurations stacked within a rack or frame. In other implementations, the electronics may be in fixed locations within the rack or frame. To prevent overheating of the servers, in some implementations, immersion cooling systems are used for cooling the servers, keeping the processors along with their associated electronics within permissible operating temperature limits, mitigating temporary malfunction or permanent failure by overheating.

Broadly, there are two different types of immersion cooling techniques: single-phase immersion cooling and two-phase immersion cooling.

For single-phase immersion cooling, in an implementation, a working fluid is actively circulated to and from a tank with electronic components by a pump for cooling. Heat from the computing devices is absorbed by the working fluid and transferred to a heat rejection device such as a radiator, dry cooler, liquid-to-liquid heat exchanger, or cooling tower, before the cooled working fluid is recirculated back to the tank.

For two-phase immersion cooling, a working fluid of a fluid bath is passively circulated in an immersion tank with electronic components by liquid-to-gas phase transition for cooling. Generally, the working fluid has a relatively low boiling point. Heat is absorbed by fluid surrounding the submerged electronic components, forming vapor bubbles. The bubbles boil off or vaporize into a gas, thereby carrying heat away from the electronic components. The vapor rises above the fluid bath where they contact a heat exchanger (at least one condenser) that is cooler than the vaporized gas. The vapor condenses back into a liquid and drip back into the fluid bath to be recycled.

Boiling and condensation heat transfer performance is dependent on surface structure and wettability, and may be represented as heat transfer curves where the heat flux is plotted as a function of surface superheat $\Delta T$ (defined as the temperature difference between the surface and the saturated liquid for boiling) or surface subcooling $\Delta T$ (defined as the temperature difference between the vapor and the condensing surface for condensation). At a low superheat, heat is mostly transferred by natural convection. As the superheat increases, vapor bubbles start to form at the onset of nucleate boiling (ONB). With the further increase of the superheat, a large number of vapor bubbles nucleate, grow, coalesce, and depart from the heated surface. Bubbles depart from the surface when the buoyancy of bubbles overcomes the surface tension. The departure of vapor bubbles can lead to significant liquid motion aiding the convective heat transfer, which induces a sharp increase of heat flux and heat transfer coefficient (HTC), which is defined as the heat flux divided by superheat, $h=q/\Delta T$. As the superheat further increases, more potential nucleation sites on the heated surface are activated due to the expansion in the nucleation site size range. Eventually, a large amount of vapor bubbles together cause the formation of a vapor blanket between the heated surface and the bulk liquid, resulting in a dramatic increase in thermal resistance between the surface and bulk liquid where the boiling crisis follows with a significant surface temperature increase.

Immersion tanks used in two-phase immersion cooling systems may include a lid to prevent vapors from escaping out of the immersion tank. For such implementations, while bubbles may form at an increasing rate, increasing fluid flow, as pressure in the immersion tank is increased, concurrently and considering an increase in the boiling point of the fluid, additional controls may be needed to monitor and regulate the temperature, pressure, etc., routed through a programmable logic controller, increasing complexity and costs.

Alternatively, lids may not be used with two-phase immersion cooling systems. For such implementations, bubbles is not formed at an increasing rate, fluid flow is not increased, and fluid evaporation increases when compared to two-phase immersion cooling systems with lids.

SUMMARY

Various aspects of the present disclosure provide a two-phase immersion cooling apparatus and a two-phase immersion cooling system for dissipating heat generated by electronic components.

According to one aspect of the present disclosure, the two-phase immersion cooling apparatus comprises a coolant tank, at least one condenser, and a heat transfer enhancer. The coolant tank is configured to retain working fluid therein and has an opening, a bottom surface opposite the opening, and a plurality of side walls. The plurality of side walls extend upwardly from a surface perimeter of the bottom surface and a liquid region and a vapor region is formed by the opening, the plurality of side walls and the bottom surface. The working fluid is retained in the liquid region and the vapor region is near to the opening. The vapor region is in fluid communication with the liquid region. The at least one condenser is at least partially disposed within the vapor region. The at least one condenser is in thermal communication with the vapor region. The heat transfer enhancer is completely disposed within the liquid region containing the working fluid and has a directed flow opening, an upper surface opposite the directed flow opening, and a plurality of containment walls. The plurality of containment walls extend downwardly from a surface perimeter of the upper surface. At least one of the plurality of containment walls and the upper surface comprise at least one redirection flow orifice. A pressure enhanced compartment comprising a pressure enhanced region and a boiling region is formed by the upper surface, the plurality of containment walls, and the directed flow opening. The pressure enhanced region is formed near to the upper surface. The at least one redirection flow orifice is disposed within the pressure enhanced region. The pressure enhanced region is in fluid communication with the boiling region.

The directed flow opening of the heat transfer enhancer and bottom surface of the coolant tank form an accelerated flow region therebetween, whereby the boiling region is in fluid communication with the accelerated flow region. The at least one of the plurality of containment walls of the heat transfer enhancer and at least one of the plurality of side walls of the coolant tank, corresponding to the at least one of the plurality of containment walls, form the at least one recycling flow region. The at least one recycling flow region is in fluid communication with the accelerated flow region.

According to another aspect of the present disclosure of the apparatus, the two-phase immersion cooling apparatus further comprises at least one heat dissipating component. The at least one heat dissipating component is configured to be removably mounted to the heat transfer enhancer and is disposed at least partially within the boiling region. Portions of the working fluid surrounding the at least one heat dissipating component absorbs sufficient heat from the at least one heat dissipating component to form a plurality of vapor bubbles. The plurality of vapor bubbles is redirected to the at least one redirection flow orifice. The at least one redirection flow orifice is configured to collapse the plurality of vapor bubbles passing therethrough.

According to another aspect of the present disclosure of the apparatus, the at least one heat dissipating component comprises at least one of a module containing at least a central processing unit (CPU), a module containing at least a graphic processing units (GPU), a module containing at least a field programmable gate array (FPGA), a module containing at least an application specific IC (ASIC), a module containing at least one heat generating component generating sufficient heat to form a plurality of vapor bubbles within the boiling region, or any combination of the foregoing. According to yet another aspect of the present disclosure of the apparatus, the heat transfer enhancer further comprises at least one of a rack or a frame, or any combination of the rack or the frame, at least partially within the boiling region, and the at least one heat dissipating component comprises a server having at least one heat generating component and at least one flow guide plate, the at least one flow guide plate comprising at least one opening portion and at least one perforated portion. An amount of the at least one perforated portion is two, and the at least one perforated portion is on opposite sides of the at least one opening, whereby the server is configured to be removably mounted to the rack or the frame, or any combination thereof. The at least one opening portion is configured for working fluid to flow therethrough, carrying heat away from the at least one heat generating component of the server. The at least one perforated portion is configured for working fluid to flow through the perforations, forming at least one directed sub-flow channel, enhancing the carrying away of heat from the at least one heat generating component via the at least one opening.

According to another aspect of the present disclosure of the apparatus, a temperature and a pressure within the enhanced compartment is greater than a temperature and a pressure within the at least one recycling flow region. Thus, maximizing heat absorption of the working fluid and enhancing nucleation and growth of the plurality of vapor bubbles, and accelerating fluid circulation from the at least one recycling flow region to the boiling region via the accelerated flow region.

According to yet another aspect of the present disclosure of the apparatus, at least one redirection flow orifice redirects the plurality of vapor bubbles near to the at least one condenser. Thus, maximizing dropwise condensation of vapor into liquid back into the liquid region containing the working fluid, recycling the working fluid.

According to another aspect of the present disclosure of the apparatus, the heat transfer enhancer further comprises at least a positioning member. The positioning member is configured to position the at least one redirection flow orifice to not be disposed within the liquid region, the at least one redirection flow orifice to be at least partially disposed within the liquid region, and the heat transfer enhancer to be completely disposed within the liquid region containing the working fluid containing the working fluid, respectively, whereby the pressure enhanced region and the boiling region, the accelerated flow region, and the at least one recycling flow region are formed.

According to another aspect of the present disclosure of the apparatus, a shape of the at least one redirection flow orifice comprises a quadrilateral shape, and the at least one redirection flow orifice is disposed on at least one of the plurality of containment walls. According to yet another aspect of the present disclosure of the apparatus, a shape of the upper surface comprises at least one frustum-shaped portion, a shape of the at least one redirection flow orifice comprises a quadrilateral shape, and the at least one redirection flow orifice is disposed on at least one side of the at least one frustum-shaped portion.

According to another aspect of the present disclosure of the apparatus, the at least one condenser comprises a condenser working fluid, an inlet, an outlet, and an external cooling source. The external cooling source is configured to cool the condenser working fluid and is in fluid communication with the outlet and the inlet.

According to yet another aspect of the present disclosure of the apparatus, the coolant tank and the heat transfer enhancer comprise at least one of a carbon steel material, an aluminum material, a stainless steel material, a metal powdered coated material, an aluminum powdered coated material, or a glass material, or any combination of the foregoing.

According to a one aspect of the present disclosure, the two-phase immersion cooling system comprises a two-phase immersion cooling apparatus, and at least one heat dissipating component. The two-phase immersion cooling apparatus comprises a coolant tank, at least one condenser, and a heat transfer enhancer. The coolant tank is configured to retain working fluid therein and has an opening, a bottom surface opposite the opening, and a plurality of side walls. The plurality of side walls extend upwardly from a surface perimeter of the bottom surface and a liquid region and a vapor region is formed by the opening, the plurality of side walls and the bottom surface. The working fluid is retained in the liquid region and the vapor region is near to the opening. The vapor region is in fluid communication with the liquid region. The at least one condenser is at least partially disposed within the vapor region. The at least one condenser is in thermal communication with the vapor region. The heat transfer enhancer is completely disposed within the liquid region containing the working fluid and has a directed flow opening, an upper surface opposite the directed flow opening, and a plurality of containment walls. The plurality of containment walls extend downwardly from a surface perimeter of the upper surface. At least one of the plurality of containment walls and the upper surface comprise at least one redirection flow orifice. A pressure enhanced compartment comprising a pressure enhanced region and a boiling region is formed by the upper surface, the plurality of containment walls, and the directed flow opening. The pressure enhanced region is formed near to the upper surface. The at least one redirection flow orifice is disposed within the pressure enhanced region. The pressure enhanced region is in fluid communication with the boiling region.

The at least one heat dissipating component is configured to be removably mounted to the heat transfer enhancer and is disposed at least partially within the boiling region. Portions of the working fluid surrounding the at least one heat dissipating component absorbs sufficient heat from the at least one heat dissipating component to form a plurality of vapor bubbles. The plurality of vapor bubbles is redirected to the at least one redirection flow orifice. The at least one redirection flow orifice is configured to collapse the plurality of vapor bubbles passing therethrough.

The directed flow opening of the heat transfer enhancer and bottom surface of the coolant tank form an accelerated flow region therebetween, whereby the boiling region is in fluid communication with the accelerated flow region. The at least one of the plurality of containment walls of the heat transfer enhancer and at least one of the plurality of side walls of the coolant tank, corresponding to the at least one of the plurality of containment walls, form the at least one recycling flow region. The at least one recycling flow region is in fluid communication with the accelerated flow region.

According to another aspect of the present disclosure of the system, the at least one heat dissipating component comprises at least one of a module containing at least a central processing unit (CPU), a module containing at least a graphic processing units (GPU), a module containing at least a field programmable gate array (FPGA), a module containing at least an application specific IC (ASIC), a module containing at least one heat generating component generating sufficient heat to form a plurality of vapor bubbles within the boiling region, or any combination of the foregoing. According to yet another aspect of the present disclosure of the system, the heat transfer enhancer further comprises at least one of a rack or a frame, or any combination of the rack or the frame, at least partially within the boiling region, and the at least one heat dissipating component comprises a server having at least one heat generating component and at least one flow guide plate, the at least one flow guide plate comprising at least one opening portion and at least one perforated portion. An amount of the at least one perforated portion is two, and the at least one perforated portion is on opposite sides of the at least one opening, whereby the server is configured to be removably mounted to the rack or the frame, or any combination thereof. The at least one opening portion is configured for working fluid to flow therethrough, carrying heat away from the at least one heat generating component of the server. The at least one perforated portion is configured for working fluid to flow through the perforations, forming at least one directed sub-flow channel, enhancing the carrying away of heat from the at least one heat generating component via the at least one opening.

According to another aspect of the present disclosure of the system, a temperature and a pressure within the enhanced compartment is greater than a temperature and a pressure within the at least one recycling flow region. Thus, maximizing heat absorption of the working fluid and enhancing nucleation and growth of the plurality of vapor bubbles, and accelerating fluid circulation from the at least one recycling flow region to the boiling region via the accelerated flow region.

According to yet another aspect of the present disclosure of the system, at least one redirection flow orifice redirects the plurality of vapor bubbles near to the at least one condenser. Thus, maximizing dropwise condensation of vapor into liquid back into the liquid region containing the working fluid, recycling the working fluid.

According to another aspect of the present disclosure of the system, the heat transfer enhancer further comprises at least a positioning member. The positioning member is configured to position the at least one redirection flow orifice to not be disposed within the liquid region, the at least one redirection flow orifice to be at least partially disposed within the liquid region, and the heat transfer enhancer to be completely disposed within the liquid region containing the working fluid containing the working fluid, respectively, whereby the pressure enhanced region and the boiling region, the accelerated flow region, and the at least one recycling flow region are formed.

According to another aspect of the present disclosure of the system, a shape of the at least one redirection flow orifice comprises a quadrilateral shape, and the at least one redirection flow orifice is disposed on at least one of the plurality of containment walls. According to yet another aspect of the present disclosure of the system, a shape of the upper surface comprises at least one frustum-shaped portion, a shape of the at least one redirection flow orifice comprises a quadrilateral shape, and the at least one redirection flow orifice is disposed on at least one side of the at least one frustum-shaped portion.

According to another aspect of the present disclosure of the system, the at least one condenser comprises a condenser working fluid, an inlet, an outlet, and an external cooling source. The external cooling source is configured to cool the condenser working fluid and is in fluid communication with the outlet and the inlet.

According to yet another aspect of the present disclosure of the system, the coolant tank and the heat transfer enhancer comprise at least one of a carbon steel material, an aluminum material, a stainless steel material, a metal powdered coated material, an aluminum powdered coated material, or a glass material, or any combination of the foregoing.

BRIEF DESCRIPTION OF THE DRAWINGS

The following figures are included to illustrate certain aspects of the embodiments, and should not be viewed as exclusive embodiments. The subject matter disclosed is capable of considerable modifications, alterations, combinations, and equivalents in form and function, as will occur to those skilled in the art and having the benefit of this disclosure.

DETAILED DESCRIPTION

Figure 1A:
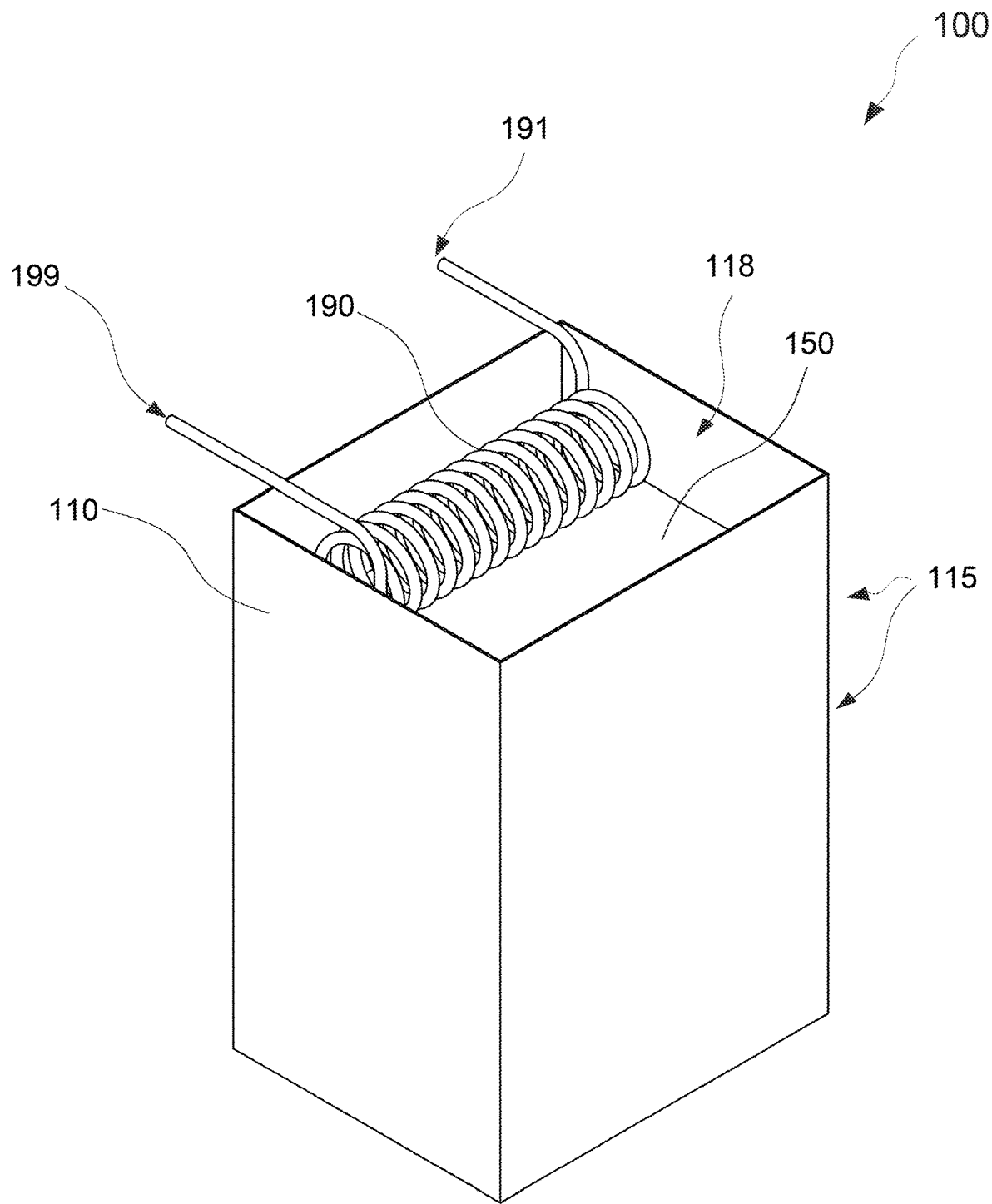
FIG. 1A illustrates a perspective view of a two-phase immersion cooling apparatus, according to disclosed embodiments.

The following describes various principles related to two-phase immersion cooling systems by way of reference to specific examples of two-phase immersion cooling apparatus', including specific arrangements and examples of coolant tanks and condensers embodying innovative concepts. More particularly, but not exclusively, such innovative principles are described in relation to selected examples of heat transfer enhancers, and redirection flow orifices and well-known functions or constructions are not described in detail for purposes of succinctness and clarity. Nonetheless, one or more of the disclosed principles can be incorporated in various other embodiments of heat transfer enhancers, and redirection flow orifices to achieve any of a variety of desired outcomes, characteristics, and/or performance criteria.

Thus, two-phase immersion cooling apparatus' having attributes that are different from those specific examples discussed herein can embody one or more of the innovative principles, and can be used in applications not described herein in detail. Accordingly, embodiments not described herein in detail also fall within the scope of this disclosure, as will be appreciated by those of ordinary skill in the relevant art following a review of this disclosure.

In the illustrated embodiments, in addition to modules and electronic components, the two-phase immersion cooling apparatus' may house high-density equipment rack-mounted assemblies, such as servers. The heat transfer enhancer of the two-phase immersion cooling apparatus', for example, may be configured to receive servers in chassis-receiving bays of an equipment support frame of a server rack (not shown). Each server, may be horizontally slidable on vertically stacked rails mounted to the equipment support frame. A number of server racks, for example, may in turn be housed together in a high-density electronic equipment facility or data center (not shown). The two-phase immersion cooling apparatus, comprise at least one heat generating component requiring cooling. For cooling, a cooling tank is filled with dielectric fluid, and servers are mounted to the heat transfer enhancer and completely immersed in the cooling tank. During operation of the servers, the dielectric fluid is kept at a boiling point. Vapor bubbles from the boiling dielectric fluid carries heat away from the at least one heat generating component. As the vapor bubbles vaporize, the vapor comes in contact with a cooled condenser. The at least one condenser allows the vapor to change back to liquid with drips back into the dielectric fluid to be recycled. For clarity of illustration, the two-phase immersion cooling apparatus is simplified, and in practice, can be varied.

Example embodiments as disclosed herein are directed to two-phase immersion cooling apparatus' comprising a coolant tank, at least one condenser, a heat transfer enhancer, and at least one heat dissipating component. Vapor and liquid regions are formed in the coolant tank. Pressure enhanced and boiling regions are formed in the heat transfer enhancer. Accelerated flow and at least one recycling flow region are formed between the heat transfer enhancer and coolant tank. The at least one condenser is in thermal communication with the vapor region. The pressure enhanced and boiling regions and accelerated flow and at least one recycling flow region, are in fluid communication thereamong. A temperature and pressure within the pressure enhanced and boiling regions is greater than that within the at least one recycling flow region, maximizing heat absorption and enhancing vapor bubble nucleation, accelerating fluid circulation from the at least one recycling flow region to the boiling region, and minimizing evaporation of the working fluid.

Figure 1B:
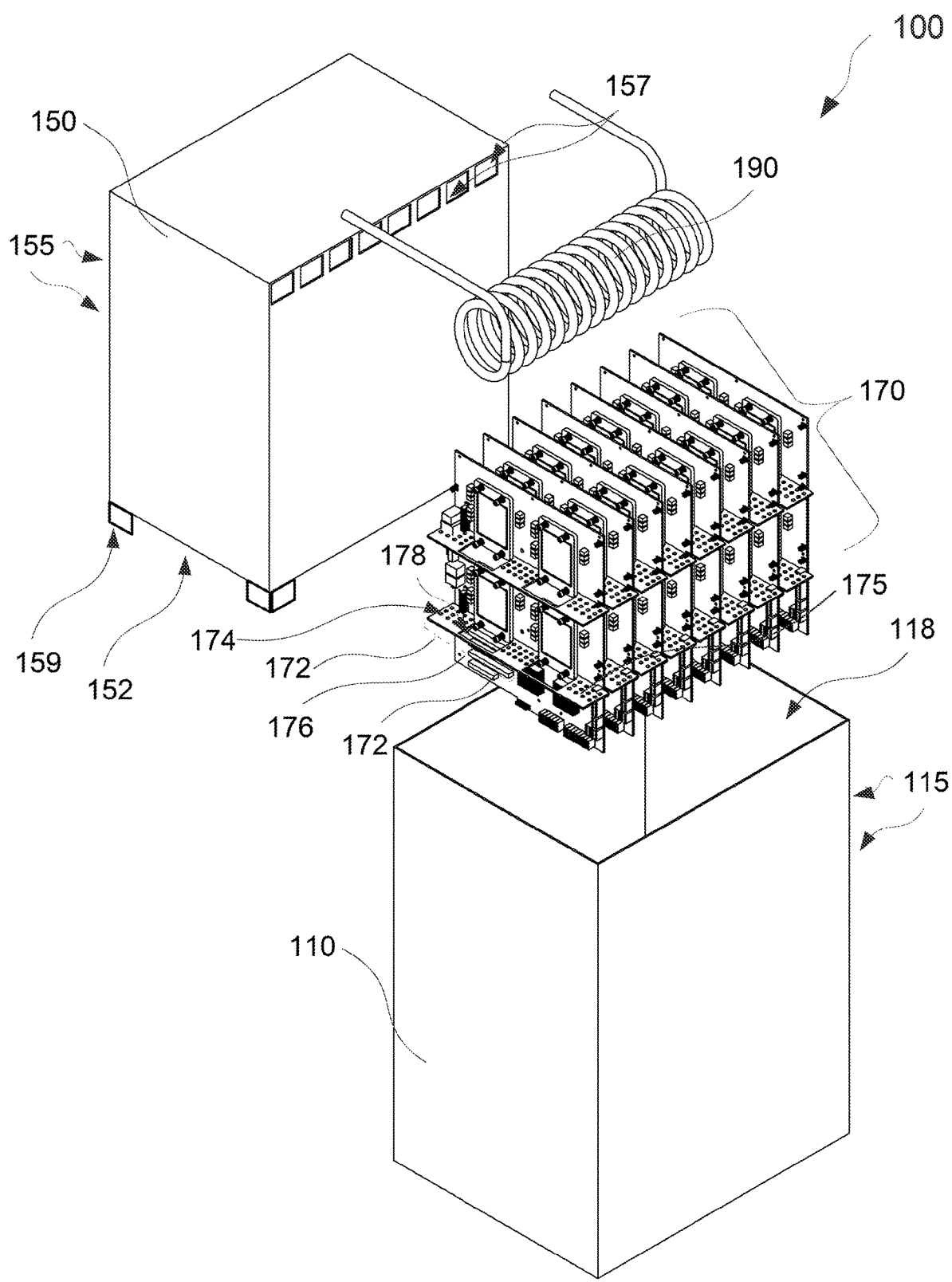
FIG. 1B illustrates an exploded view of the two-phase immersion cooling apparatus of FIG. 1A, according to disclosed embodiments.
Figure 2A:
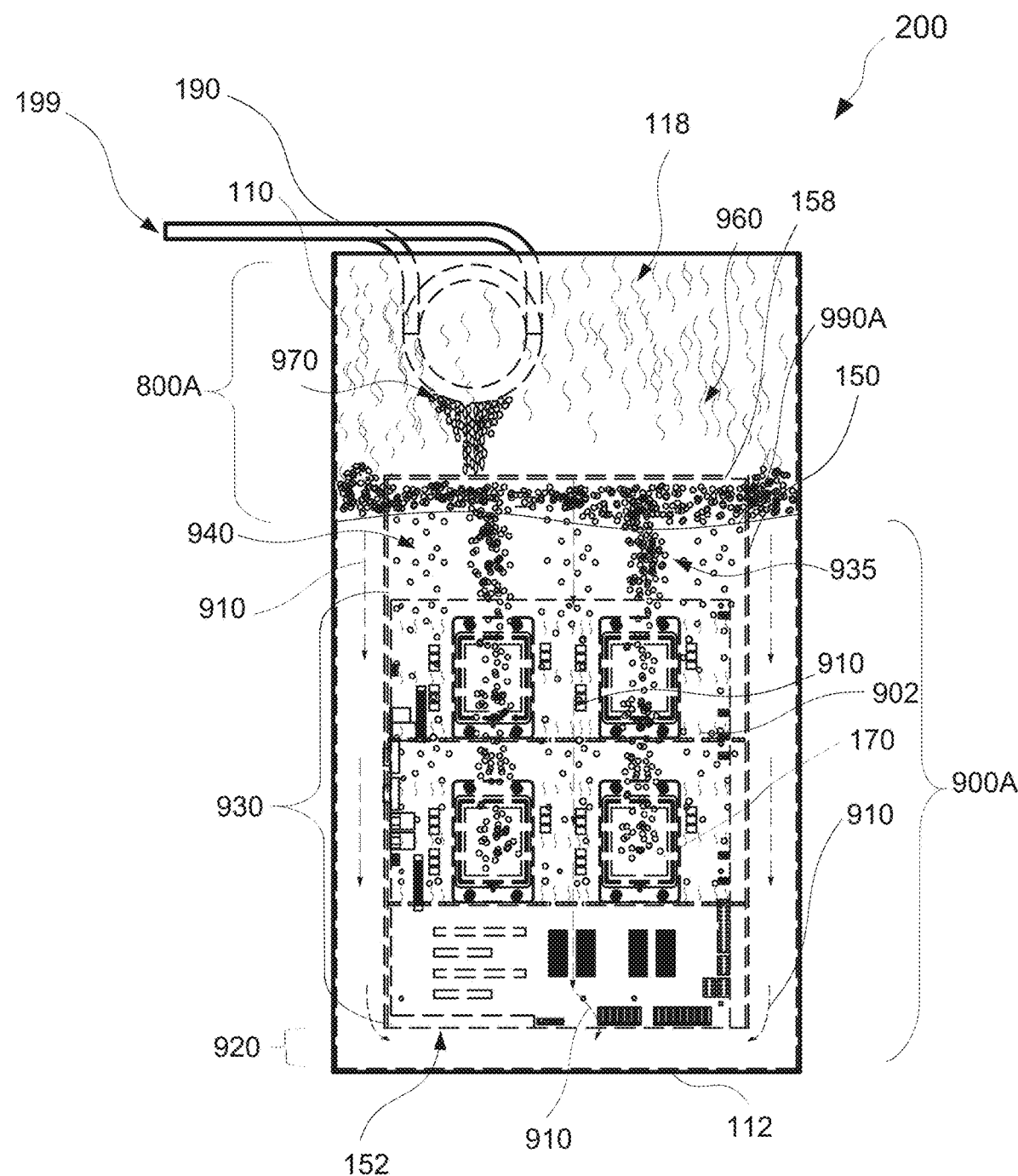
FIG. 2A illustrates an internal view of another two-phase immersion cooling apparatus including a liquid region, according to disclosed embodiments.
Figure 2B:
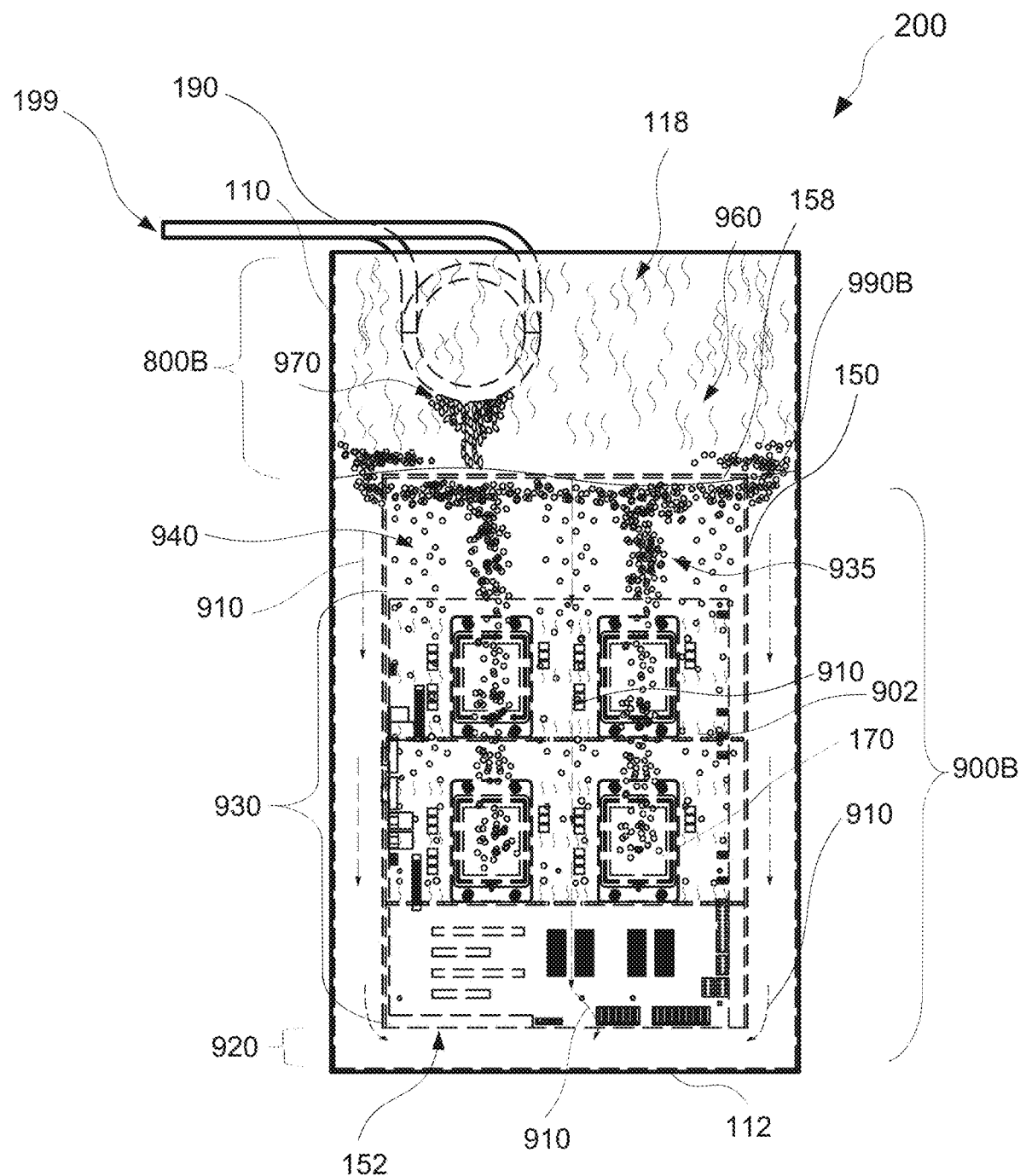
FIG. 2B illustrates an internal view of another two-phase immersion cooling apparatus including another liquid region, according to disclosed embodiments.
Figure 2C:
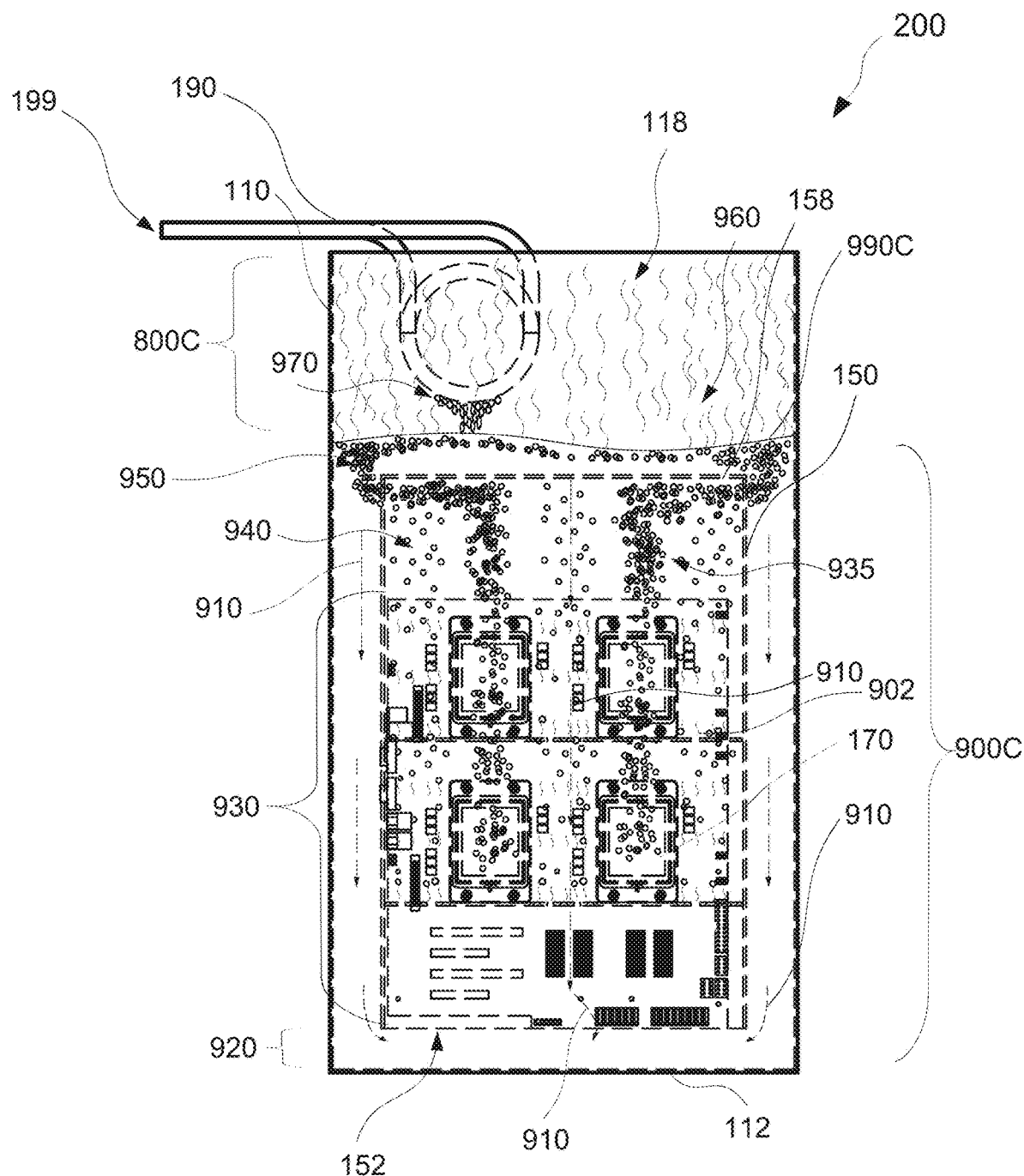
FIG. 2C illustrates an internal view of another two-phase immersion cooling apparatus including yet another liquid region, according to disclosed embodiments.

FIGS. 1A and 1B illustrate a perspective view and an exploded view, respectively, of a two-phase immersion cooling apparatus, according to disclosed embodiments. FIG. 2A illustrates an internal view of another two-phase immersion cooling apparatus including a liquid region, according to disclosed embodiments. FIG. 2B illustrates an internal view of another two-phase immersion cooling apparatus including another liquid region, according to disclosed embodiments. FIG. 2C illustrates an internal view of another two-phase immersion cooling apparatus including yet another liquid region, according to disclosed embodiments. As illustrated in FIGS. 1A-2C, a two-phase immersion cooling apparatus 100 comprising a coolant tank 110, at least one condenser 190, and a heat transfer enhancer 150 is provided. The coolant tank 110 is configured to retain working fluid therein. In the illustrated embodiments, the working fluid is dielectric fluid known in the art. As illustrated, a shape of the two-phase immersion cooling apparatus 100 comprises a cuboid shape having an opening 118, a bottom surface 112 opposite the opening 118, and a plurality of side walls 115. The plurality of side walls 115 extend upwardly from a surface perimeter of the bottom surface 112 and a liquid region 900A, 900B, 900C and a vapor region 800A, 800B, 800C, respectively, is formed by the opening 118, the plurality of side walls 115 and the bottom surface 112. The working fluid is retained in the liquid region 900A, 900B, 900C and the vapor region 800A, 800B, 800C is near to the opening 118. The vapor region 800A, 800B, 800C is in fluid communication with the liquid region 900A, 900B, 900C, respectively. The at least one condenser 190 is at least partially disposed within the vapor region 800A, 800B, 800C. The at least one condenser 190 is in thermal communication with the vapor region 800A, 800B, 800C. The at least one redirection flow orifice 157 of the heat transfer enhancer 150 is not disposed within the liquid region 900A, the at least one redirection flow orifice 157 of the heat transfer enhancer 150 is at least partially disposed within the liquid region 900B, and the heat transfer enhancer 150 is completely disposed within the liquid region 900A containing the working fluid. As illustrated, a shape of the heat transfer enhancer 150 comprises a cuboid shape having a directed flow opening 152, an upper surface 158 opposite the directed flow opening 152, and a plurality of containment walls 155. The plurality of containment walls 155 extend downwardly from a surface perimeter of the upper surface 158. At least one of the plurality of containment walls 155 and the upper surface 158 comprise at least one redirection flow orifice 157. The heat transfer enhancer 150 forms a pressure enhanced compartment comprising a pressure enhanced region 940 and a boiling region 930 by the upper surface 158, the plurality of containment walls 155, and the directed flow opening 152. The pressure enhanced region 940 is formed near to the upper surface 158. The at least one redirection flow orifice 157 is disposed within the pressure enhanced region 940. The pressure enhanced region 940 is in fluid communication with the boiling region 930.

The directed flow opening 152 of the heat transfer enhancer 150 and bottom surface 112 of the coolant tank 110 form an accelerated flow region 920 therebetween, whereby the boiling region 930 is in fluid communication with the accelerated flow region 920. The at least one of the plurality of containment walls 155 of the heat transfer enhancer 150 and at least one of the plurality of side walls 115 of the coolant tank 110, corresponding to the at least one of the plurality of containment walls 155, form the at least one recycling flow region 910. The at least one recycling flow region 910 is in fluid communication with the accelerated flow region 920.

As shown in FIG. 1B, the heat transfer enhancer 150 includes at least a positioning member 159. The positioning member 159 is not shown in FIG. 2A, for clarity of illustration. As illustrated in FIGS. 1A-1B, the positioning member 159 is a plurality of L-shaped supports, positioning the at least one redirection flow orifice 157 of the heat transfer enhancer 150 to not be disposed within the liquid region 900A, the at least one redirection flow orifice 157 of the heat transfer enhancer 150 to be at least partially disposed within the liquid region 900B, and the heat transfer enhancer 150 to be completely disposed within the liquid region 900C containing the working fluid, respectively, whereby the pressure enhanced region 940 and the boiling region 930, the accelerated flow region 920, and the at least one recycling flow region 910 are formed. It will be understood that the positioning member 159 is not limited to having any particular shape and size and being a support, and the positioning member 159 may be other shapes and sizes and be a rack or a frame, for instance, attached to at least one of the bottom surface 112 and/or the plurality of side walls 115 or hung on a rim of the coolant tank 110, without departing from the scope of the disclosure. As long as the at least one redirection flow orifice 157 of the heat transfer enhancer 150 may be positioned to not be disposed within the liquid region 900A, the at least one redirection flow orifice 157 of the heat transfer enhancer 150 may be positioned to be at least partially disposed within the liquid region 900B, and the heat transfer enhancer 150 may be positioned to be completely disposed within the liquid region 900C containing the working fluid, respectively, whereby the pressure enhanced region 940 and the boiling region 930, the accelerated flow region 920, and the at least one recycling flow region 910 are formed.

Figure 3A:
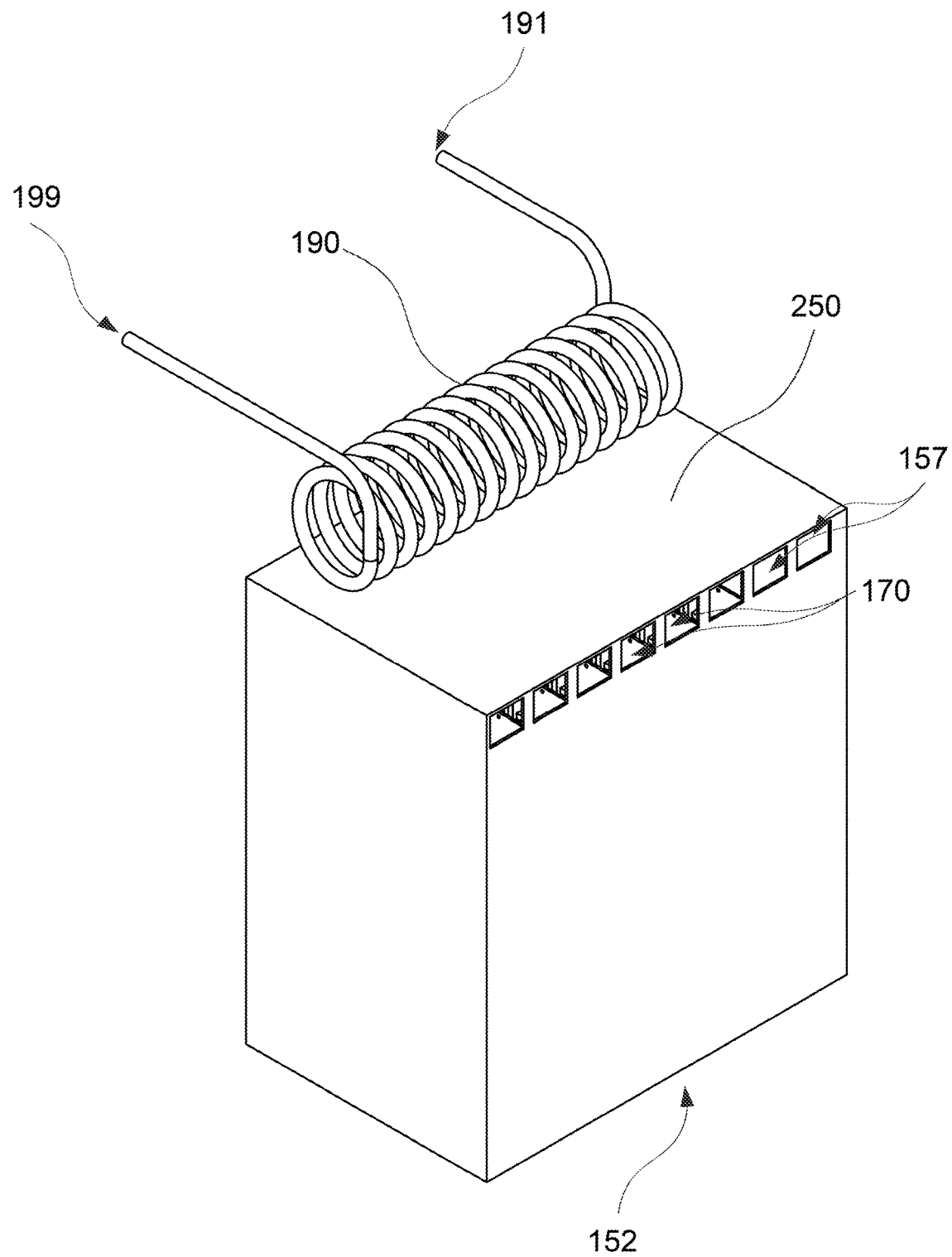
FIG. 3A illustrates a top perspective view of the two-phase immersion cooling apparatus of FIG. 2A, without a cooling tank, according to disclosed embodiments.

FIG. 3A illustrates a top perspective view of the two-phase immersion cooling apparatus of FIG. 2A, without a cooling tank, according to disclosed embodiments. As illustrated, the at least one condenser 190 comprises thermally conductive condensing coils having condenser working fluid (not shown), an inlet 191, an outlet 199, and an external cooling source (not shown); however, the embodiments are not limited thereto. The at least one condenser 190 may include radiator fins and/or similar equipment which increases the surface area of the at least one condenser 190, thereby allowing greater and/or more rapid condensation of the gaseous dielectric fluid and returning it to a liquid form.

Cooling components may include, for example, condensers, condensing coils, and/or radiators at least partially disposed within the vapor region 800A, 800B, 800C (as shown in FIG. 2A-2C) and in thermal communication with the vapor region 800A, 800B, 800C, as well as coils which reject heat from the exhaust of any powered components including, for example, motors, pumps, and/or utility cabinets.

The external cooling source (not shown) is configured to cool the condenser working fluid (not shown) and is in fluid communication with the outlet 199 and the inlet 191. In the illustrated embodiments, the working fluid may be chilled using evaporative cooling, dry cooling, and/or other methods of chilling known in the art; however, the embodiments are not limited thereto. The working fluid may also be at ambient temperature and not actively cooled. As long as dropwise condensation of vapor into liquid 970 (as shown in FIG. 2A-2C) back into the liquid region 900A, 900B, 900C (as shown in FIG. 2A-2C) containing the working fluid, recycling the working fluid is achieved.

In the above illustrated embodiments, the coolant tank and the heat transfer enhancer comprise at least one of a carbon steel material, an aluminum material, a stainless steel material, a metal powdered coated material, an aluminum powdered coated material, or a glass material, or any combination of the foregoing.

Figure 3B:
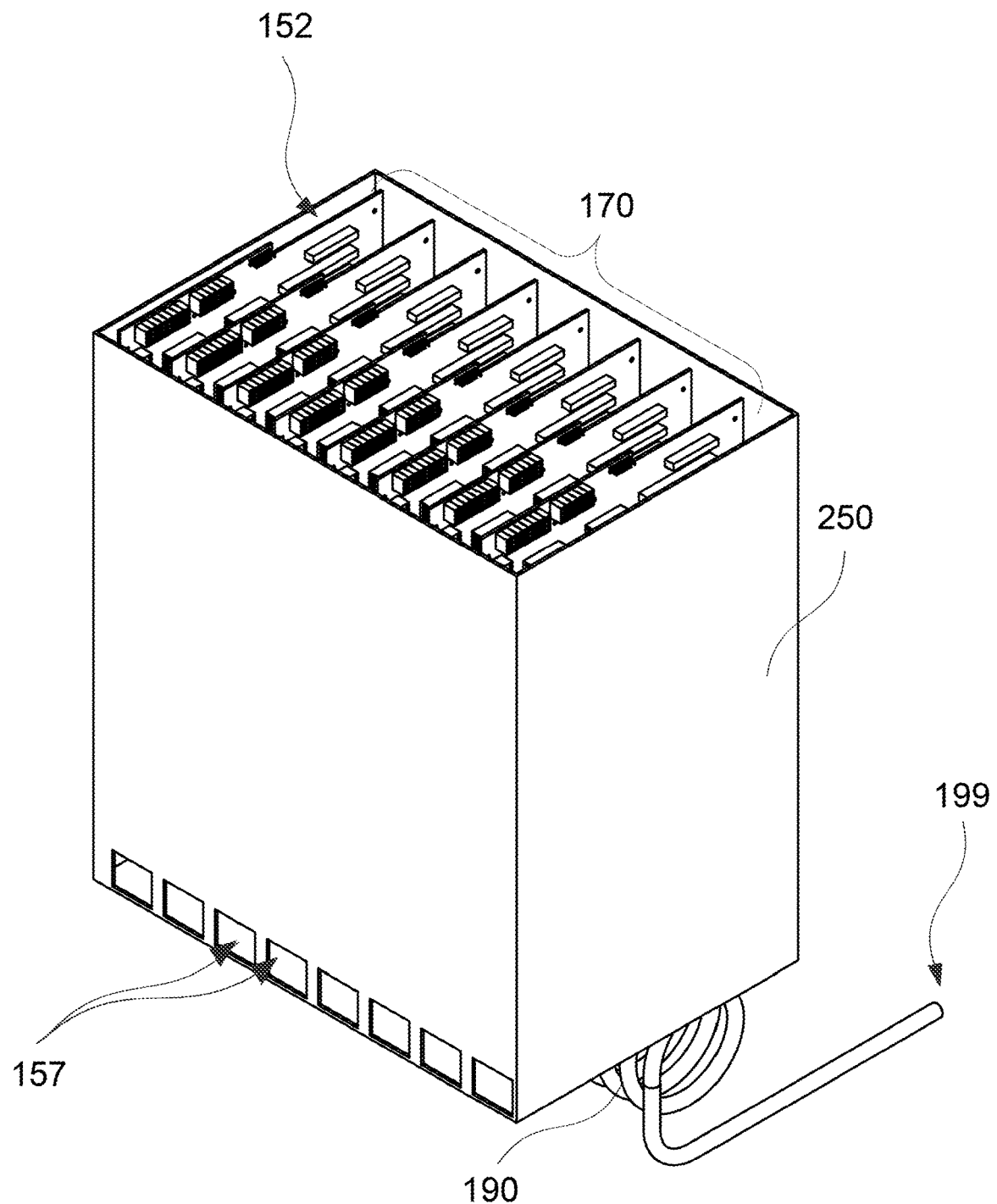
FIG. 3B illustrates a bottom perspective view of the two-phase immersion cooling apparatus of FIG. 2A, without a cooling tank, according to disclosed embodiments.
Figure 4A:
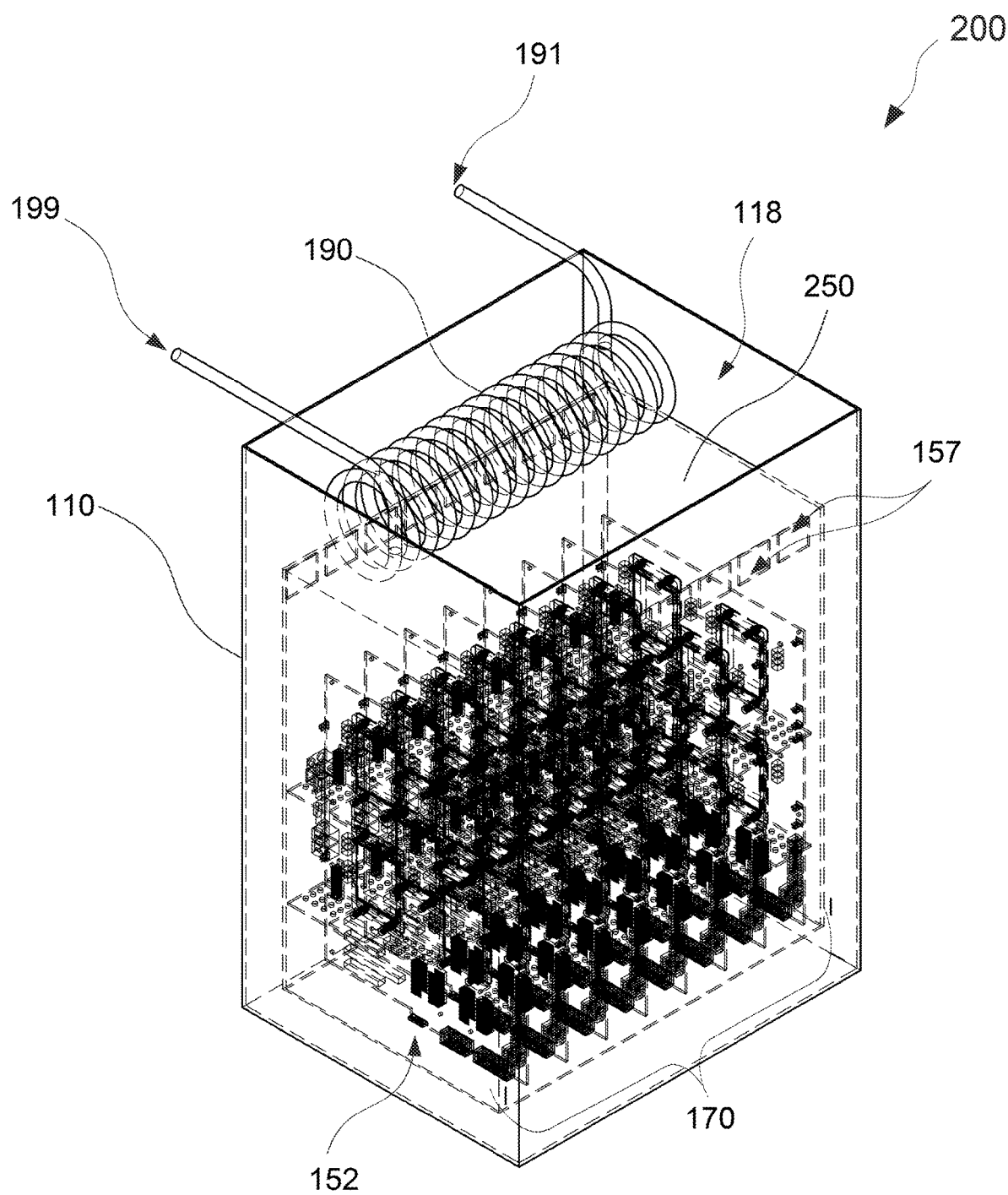
FIG. 4A illustrates a top internal view of the another two-phase immersion cooling apparatus of FIG. 2A, according to disclosed embodiments.
Figure 4B:
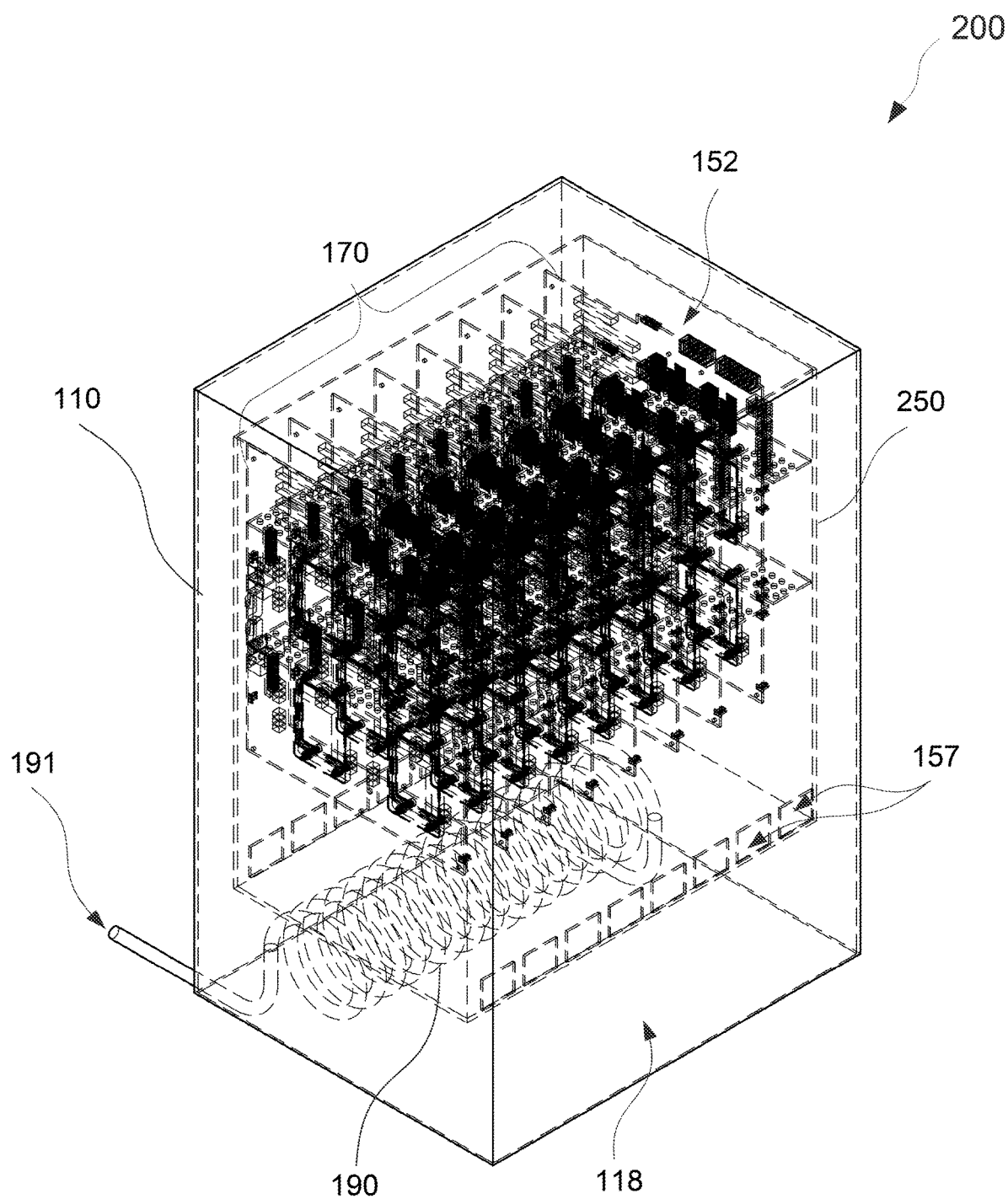
FIG. 4B illustrates a bottom internal view of the another two-phase immersion cooling apparatus of FIG. 2A, according to disclosed embodiments.

FIG. 3B illustrates a bottom perspective view of the two-phase immersion cooling apparatus of FIG. 2A, without a cooling tank, according to disclosed embodiments. FIG. 4A illustrates a top internal view of the another two-phase immersion cooling apparatus of FIG. 2A, according to disclosed embodiments. FIG. 4B illustrates a bottom internal view of the another two-phase immersion cooling apparatus of FIG. 2A, according to disclosed embodiments. As illustrated in FIGS. 3B-4B, and referring again to FIG. 2A-2C, the two-phase immersion cooling apparatus 100, 200 further comprises at least one heat dissipating component 170. The at least one heat dissipating component 170 is configured to be removably mounted to the heat transfer enhancer 150 and is disposed at least partially within the boiling region 930. Portions of the working fluid surrounding the at least one heat dissipating component 170 absorbs sufficient heat from the at least one heat dissipating component 170 to form a plurality of vapor bubbles 935. The plurality of vapor bubbles 935 is redirected to at least one portion of a surface 990A, 990B, 990C of the liquid region 900A, 900B, 900C, respectively, via the at least one redirection flow orifice 157. The at least one redirection flow orifice 157 is configured to collapse the plurality of vapor bubbles passing therethrough. The at least one redirection flow orifice 157 is further configured to form at least one redirection vapor bubble flow channel 950 is between the at least one portion of a surface of the liquid region 900B, 900C and the at least one redirection flow orifice 157. The at least one redirection vapor bubble flow channel 950 is in fluid communication with the vapor region 800B, 800C on one end and pressure enhanced region 940 on another end.

In the illustrated embodiments, the two-phase immersion cooling apparatus 100, 200 of FIGS. 1A-2C may further comprise the at least one heat dissipating component 170 and may initially comprise the at least one heat dissipating component 170 and both may be similar in some respects. It will be understood that all references in the illustrated embodiments of the two-phase immersion cooling apparatus 100, 200, including specific arrangements and examples of coolant tanks 110 and condensers 190 embodying innovative concepts and innovative principles described in relation to selected examples of heat transfer enhancers 150, and redirection flow orifices 157 and well-known functions or constructions, may be applied to the two-phase immersion cooling system further comprising and initially comprising the two-phase immersion cooling apparatus 100, 200.

In the illustrated embodiments, the at least one heat dissipating component 170 comprises at least one of a module containing at least a central processing unit (CPU), a module containing at least a graphic processing units (GPU), a module containing at least a field programmable gate array (FPGA), a module containing at least an application specific IC (ASIC), a module containing at least one heat generating component generating sufficient heat to form a plurality of vapor bubbles 935 within the boiling region 930, or any combination of the foregoing; however, the illustrated embodiments are not limited thereto. In further illustrated embodiments, the heat transfer enhancer 150 further comprises at least one of a rack or a frame (not shown), or any combination of the rack or the frame, at least partially within the boiling region 930, and the at least one heat dissipating component 170 comprises a server. The server is configured to be removably mounted to the rack or the frame (not shown), or any combination thereof. In yet further illustrated embodiments, the at least one heat dissipating component 170 comprises a server having the at least one heat generating component and at least one flow guide plate 170. The at least one flow guide plate 170 comprises at least one opening portion 176 and at least one perforated portion 172. An amount of the at least one perforated portion 172 is two, and the at least one perforated portion 172 is on opposite sides of the at least one opening. The server is configured to be removably mounted to the rack or the frame, or any combination thereof, and the at least one opening portion 176 is configured for working fluid to flow therethrough, carrying heat away from the at least one heat generating component of the server. The at least one perforated portion 172 comprises at least one perforation 174 and is configured for working fluid to flow through the at least one perforation 174, forming at least one directed sub-flow channel 902, enhancing the carrying away of heat from the at least one heat generating component via the at least one opening.

In the illustrated embodiments, the at least one heat dissipating component 170 comprises eight printed circuit boards (PCBs) or motherboards, each having four heat generating components and two at least one flow guide plate 170 thereon. Each at least one flow guide plate 170 having two at least one opening portion 176 and three at least one perforated portion 172. It will be understood that more or less than eight printed circuit boards (PCBs) or motherboards may be removably mounted within the heat transfer enhancer 150 and more or less than four heat generating components, and more or less than two at least one flow guide plate 170 having more or less than two at least one opening portion 176 and three at least one perforated portion 172, may be mounted to each printed circuit boards (PCBs) or motherboards.

In the illustrated embodiments, a temperature and a pressure within the enhanced compartment is greater than a temperature and a pressure within the at least one recycling flow region 910. Thus, maximizing heat absorption of the working fluid and enhancing nucleation and growth of the plurality of vapor bubbles 935, and accelerating fluid circulation from the at least one recycling flow region 910 to the boiling region 930 via the accelerated flow region 920.

In the illustrated embodiments, the at least one redirection flow orifice 157 redirects the plurality of vapor bubbles 935 near to the at least one condenser 190. Thus, maximizing dropwise condensation of vapor into liquid 970 back into the liquid region 900A, 900B, 900C containing the working fluid, recycling the working fluid.

In the illustrated embodiments, at least one of the at least one redirection flow orifice 157 and/or at least one of the at least one redirection vapor bubble flow channel 950 from at least one of the at least one redirection flow orifice 157 redirects the plurality of vapor bubbles 935 near to the at least one condenser 190. Thus, maximizing dropwise condensation of vapor into liquid 970 back into the liquid region 900A, 900B, 900C containing the working fluid, recycling the working fluid.

As illustrated, a shape of the at least one redirection flow orifice 157 comprises a quadrilateral shape, and the at least one redirection flow orifice 157 is disposed on at least one of the plurality of containment walls 155. As illustrated, eight redirection flow orifices 157 are disposed adjacent to an edge of the upper surface 158 and eight redirection flow orifices 157 are disposed adjacent to an opposing edge of the upper surface 158. It will be understood that the at least one redirection flow orifice 157 may be other shapes, sizes, and amounts known in the art.

In the illustrated embodiments, the location of the at least one condenser 190 at least partially disposed within the vapor region 800A, 800B, 800C and in thermal communication with the vapor region 800A, 800B, 800C, may be configured in order to optimize the flow of vapor phase dielectric fluid and increase the rate and/or efficiency of condensation.

Figure 5A:
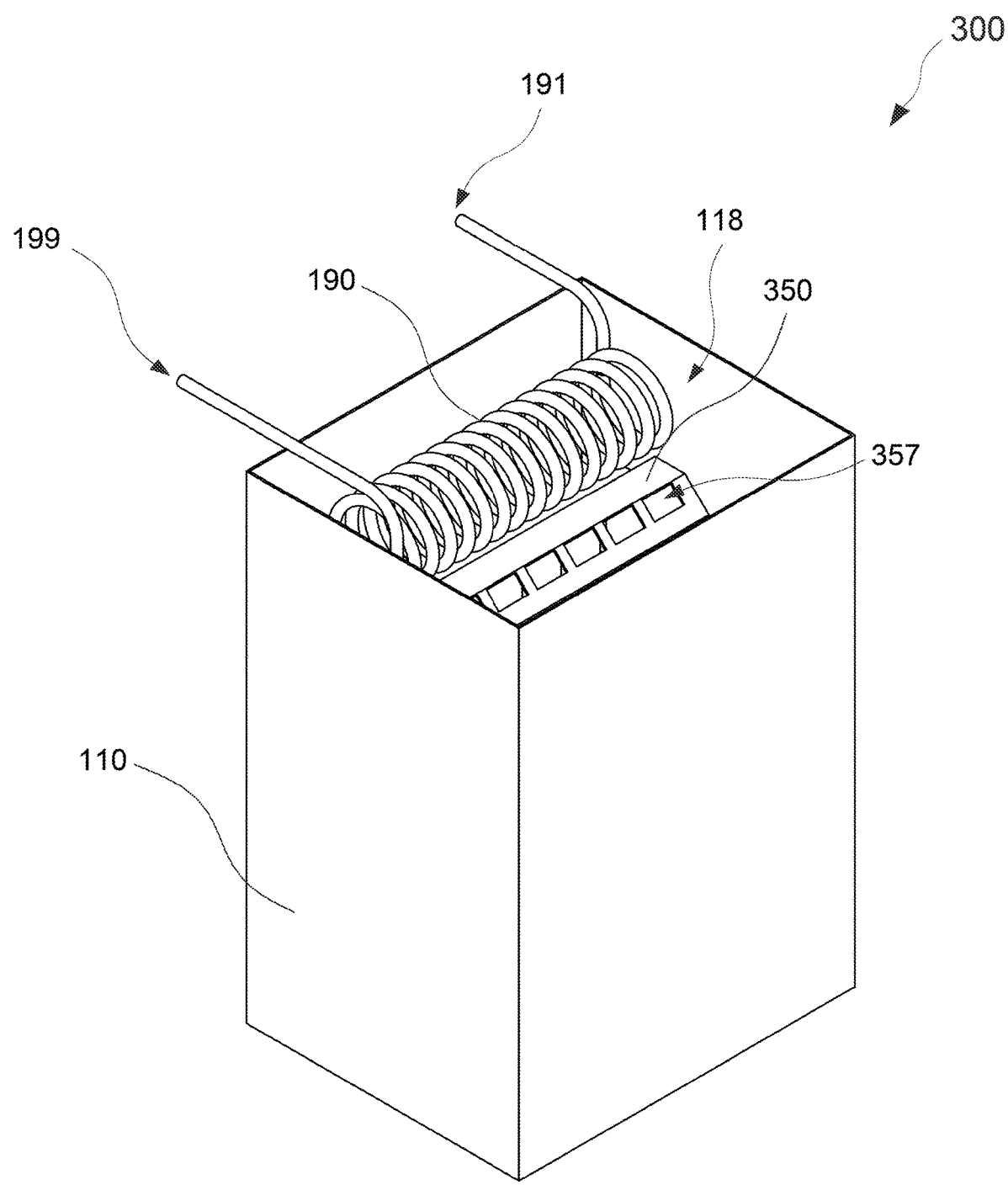
FIG. 5A illustrates a perspective view of yet another two-phase immersion cooling apparatus, according to disclosed embodiments.
Figure 5B:
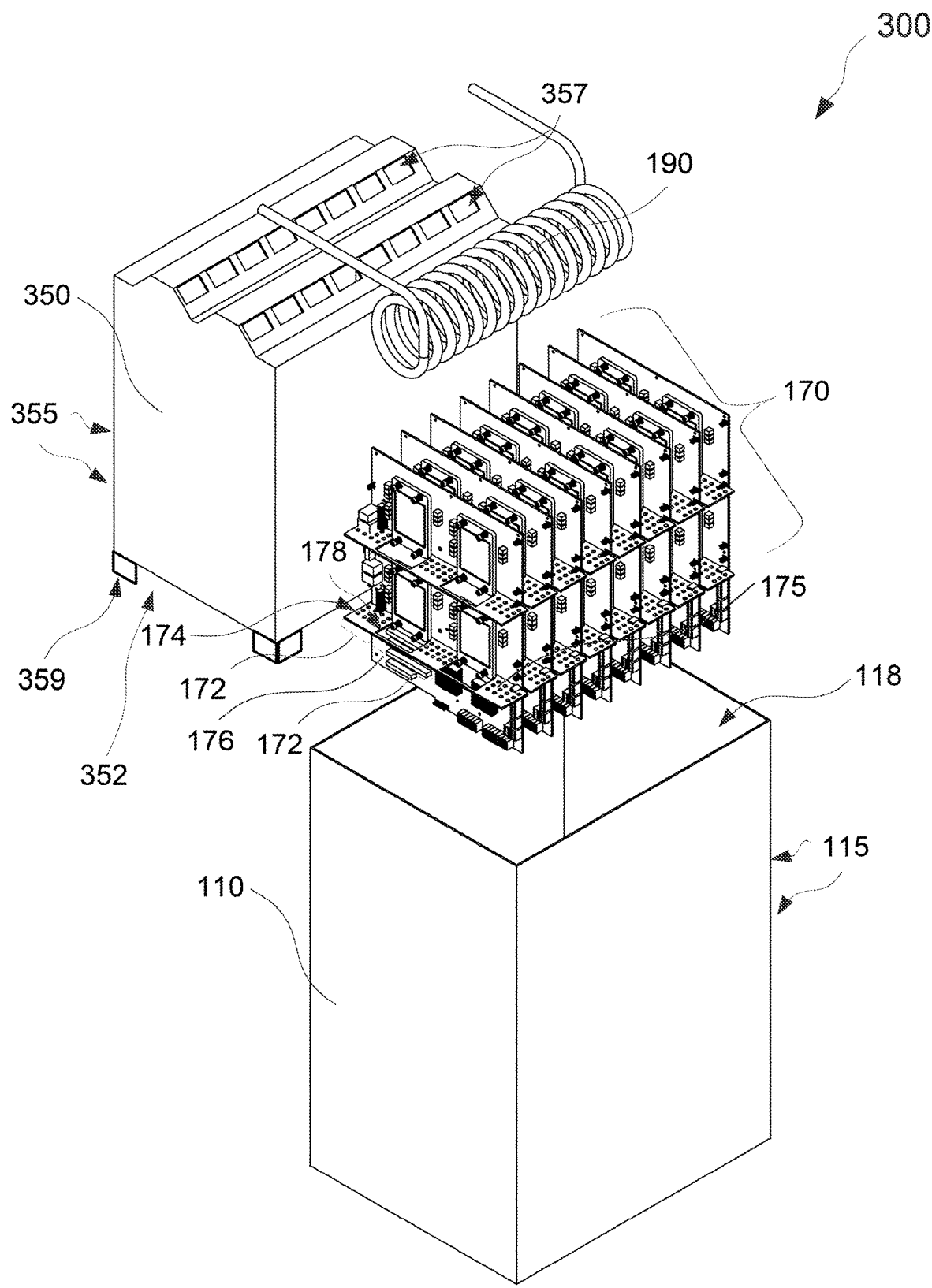
FIG. 5B illustrates an exploded view of the yet another two-phase immersion cooling apparatus of FIG. 5A, according to disclosed embodiments.
Figure 6A:
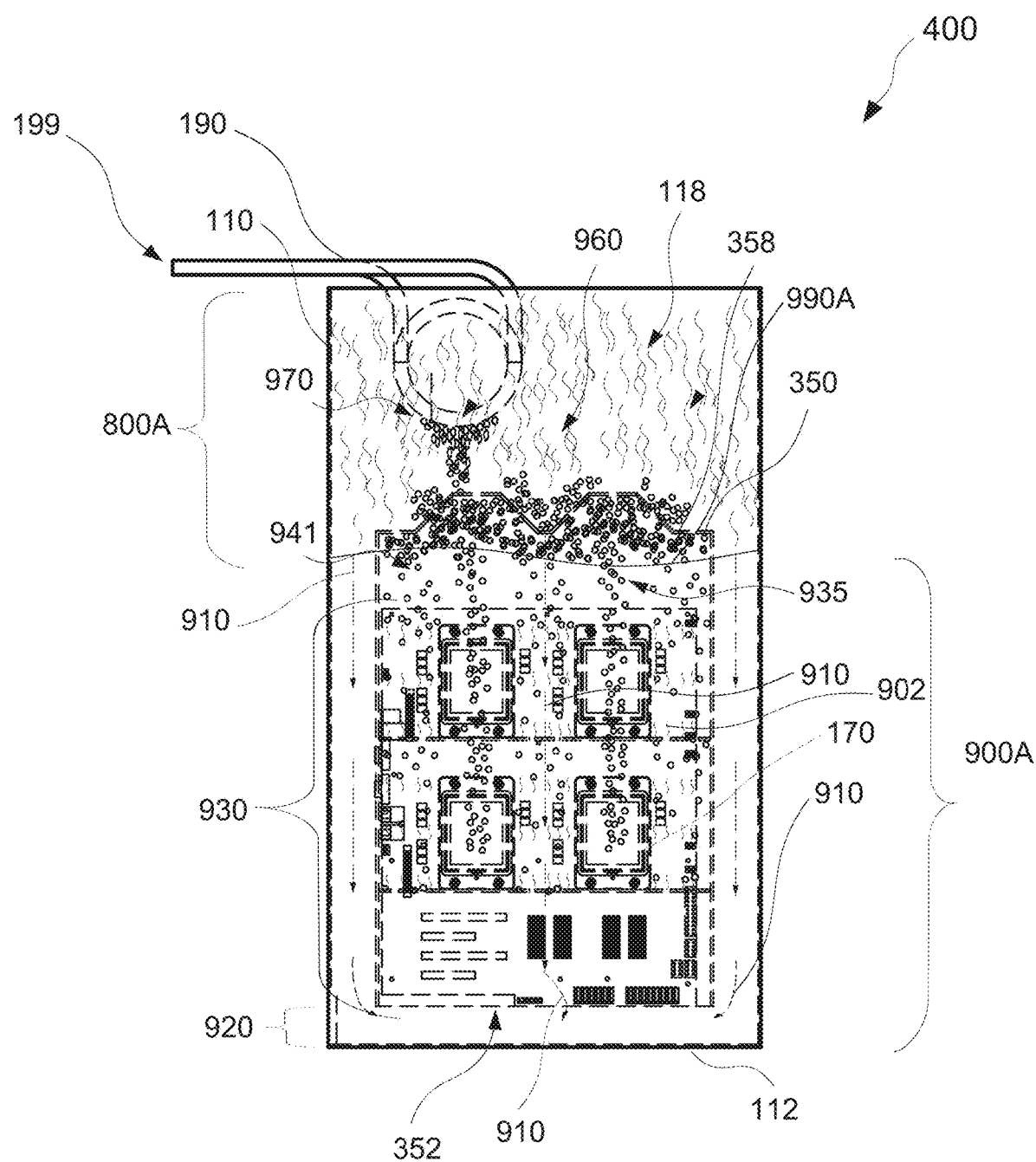
FIG. 6A illustrates an internal view of another two-phase immersion cooling apparatus including a liquid region, according to disclosed embodiments.
Figure 6B:
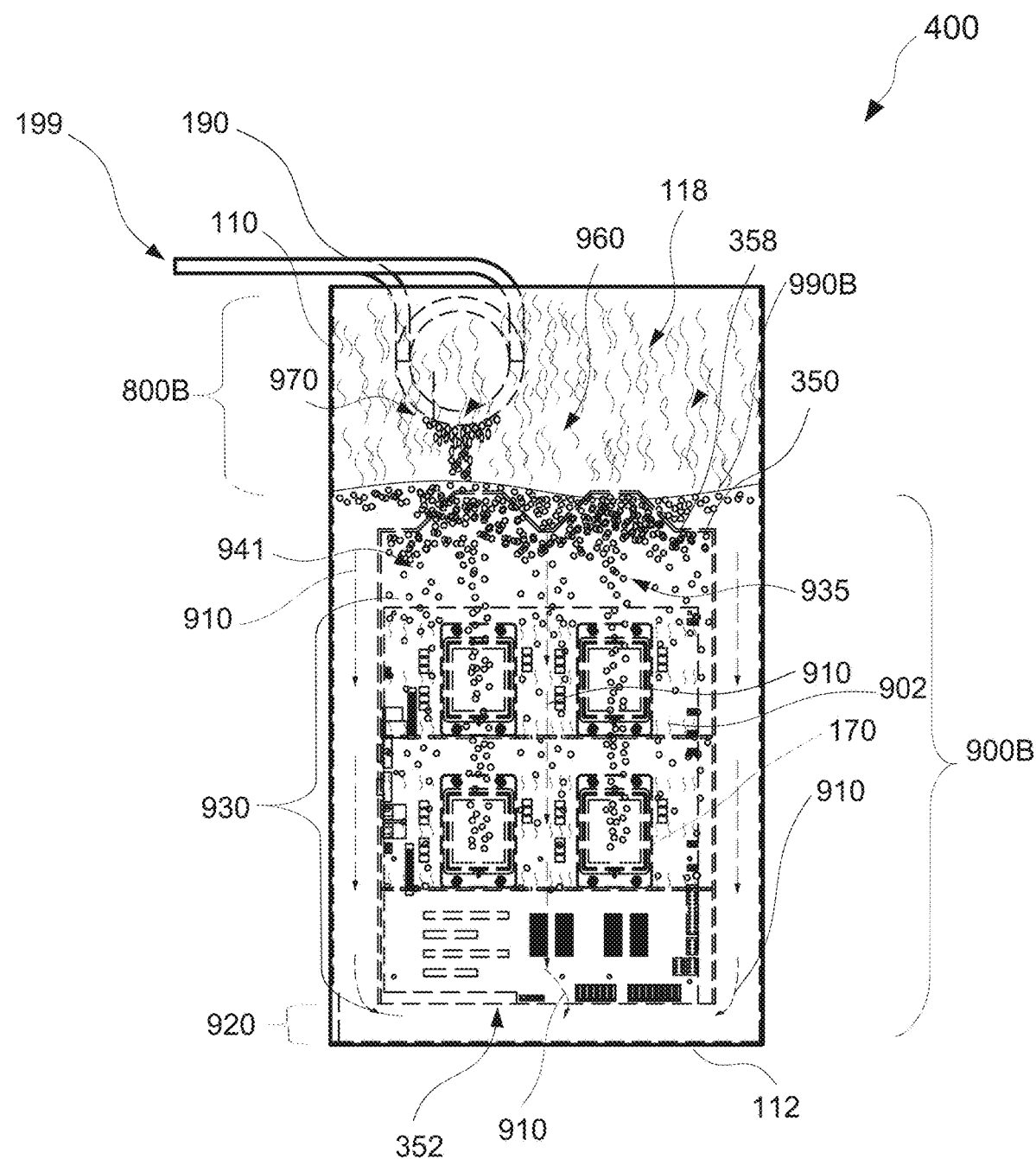
FIG. 6B illustrates an internal view of another two-phase immersion cooling apparatus including another liquid region, according to disclosed embodiments.
Figure 6C:
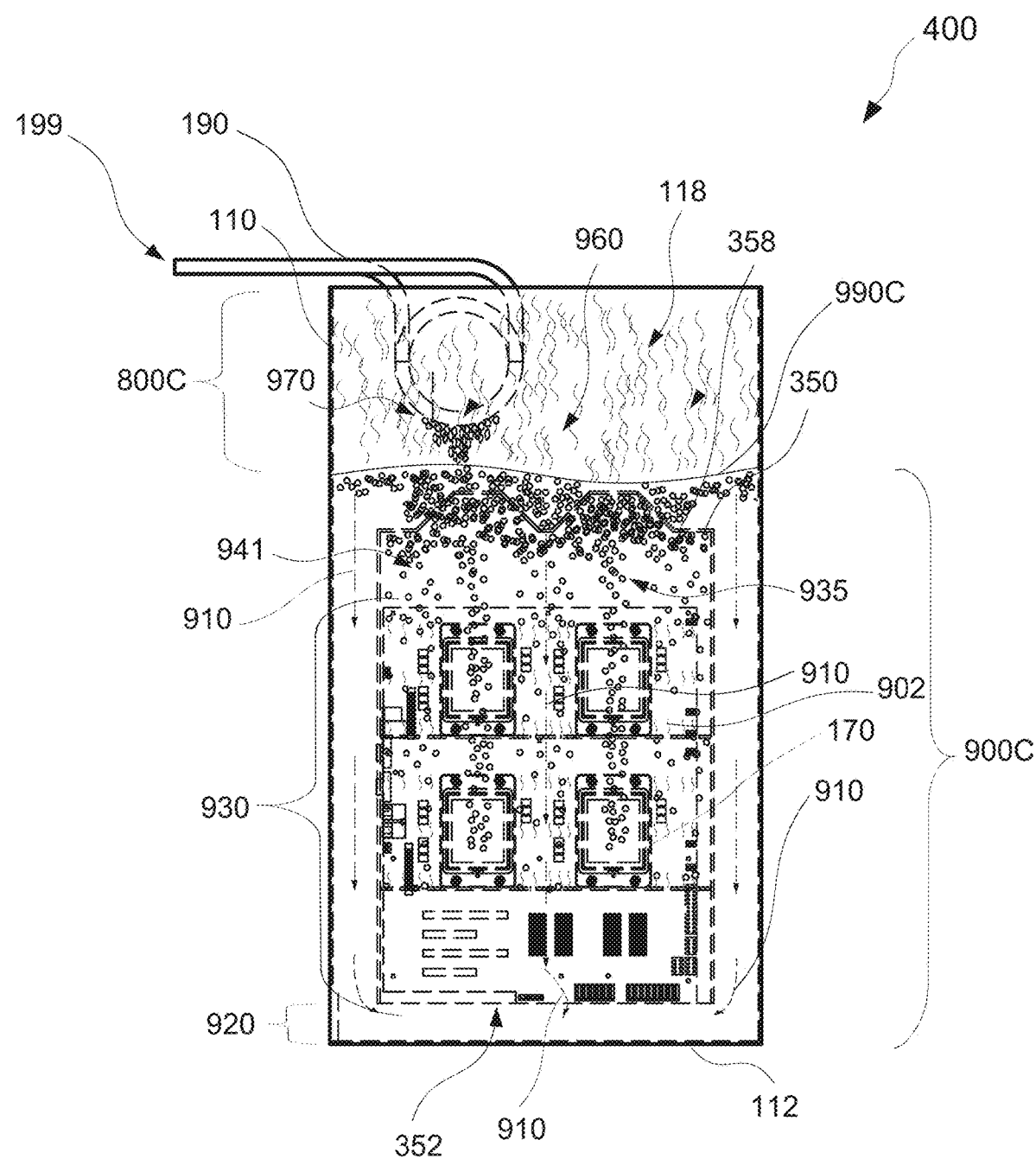
FIG. 6C illustrates an internal view of another two-phase immersion cooling apparatus including yet another liquid region, according to disclosed embodiments.

FIG. 5A illustrates a perspective view of yet another two-phase immersion cooling apparatus, according to disclosed embodiments. FIG. 5B illustrates an exploded view of the yet another two-phase immersion cooling apparatus of FIG. 5A, according to disclosed embodiments. FIG. 6A illustrates an internal view of another two-phase immersion cooling apparatus including a liquid region, according to disclosed embodiments. FIG. 6B illustrates an internal view of another two-phase immersion cooling apparatus including another liquid region, according to disclosed embodiments. FIG. 6C illustrates an internal view of another two-phase immersion cooling apparatus including yet another liquid region, according to disclosed embodiments. As illustrated, the two-phase immersion cooling apparatus 300, 400 of FIGS. 5A-6C may be similar in some respects to the two-phase immersion cooling apparatus 100, 200 of FIGS. 1A-2C, and thus may be best understood with reference thereto where like numerals designate like components not described again in detail. Unlike the generally flat shape of the upper surface 158, the upper surface 358 comprises at least one frustum-shaped portion. As illustrated, the frustum-shaped portion is stretched from one wall of the plurality of containment walls 355 to an opposing wall of the plurality of containment walls and the upper surface 358 comprises two frustum-shaped portions. Additionally, while the shape of the at least one redirection flow orifice 357 comprises a quadrilateral shape, unlike the at least one redirection flow orifice 157, the at least one redirection flow orifice 357 is disposed on opposing sides of the at least one frustum-shaped portion. Eight redirection flow orifices 357 are disposed on four sides of two of the at least one frustum-shaped portions. It will be understood that upper surface 358 is not limited to having any particular shape and size and having two shaped portions, and the upper surface 358 may be other shapes and sizes and have one shaped portion or more than two shaped portions. For instance, the upper surface may comprise a plurality of cuboid-shaped portions not stretched from one wall of the plurality of containment walls 355 to an opposing wall of the plurality of containment walls, without departing from the scope of the disclosure. It will also be understood that the at least one redirection flow orifice 357 is not limited to having any particular shape, size, and amount, and the at least one redirection flow orifice 357 may be other shapes, sizes, and amounts. For instance, the at least one redirection flow orifice 357 may be triangular-shaped and less than eight triangular-shaped redirection flow orifices may be disposed on opposing sides of one frustum-shaped portion, without departing from the scope of the disclosure. As long as at least one of the at least one redirection flow orifice 357 and/or at least one of the at least one redirection vapor bubble flow channel 950 from at least one of the at least one redirection flow orifice 357 redirects the plurality of vapor bubbles 935 near to the at least one condenser 190 and pressure within the pressure enhanced regions 940 and boiling regions 930 are controlled, such that a large amount of vapor bubbles 935 together do not cause a formation of a vapor blanket between a heated surface of the at least one heat dissipating component 170 and the bulk fluid.

As illustrated in FIGS. 5A-6C, a two-phase immersion cooling apparatus 300 comprising a coolant tank 110, at least one condenser 190, and the heat transfer enhancer 350 is provided. As illustrated, a shape of the two-phase immersion cooling apparatus 300 comprises a cuboid shape having an opening 118, a bottom surface 112 opposite the opening 118, and a plurality of side walls 115. A liquid region 900A, 900B, 900C and a vapor region 800A, 800B, 800C, respectively, is formed by the opening 118, the plurality of side walls 115 and the bottom surface 112. The working fluid is retained in the liquid region 900A, 900B, 900C and the vapor region 800A, 800B, 800C is near to the opening 118. The vapor region 800A, 800B, 800C is in fluid communication with the liquid region 900A, 900B, 900C, respectively. The at least one condenser 190 is at least partially disposed within the vapor region 800A, 800B, 800C. The at least one condenser 190 is in thermal communication with the vapor region 800A, 800B, 800C. The at least one redirection flow orifice 357 of the heat transfer enhancer 350 is not disposed within the liquid region 900A, the at least one redirection flow orifice 357 of the heat transfer enhancer 350 is at least partially disposed within the liquid region 900B, and the heat transfer enhancer 350 is completely disposed within the liquid region 900C containing the working fluid. As illustrated, a shape of the heat transfer enhancer 350 comprises a generally cuboid shape having a directed flow opening 352, an upper surface 358 opposite the directed flow opening 352, and a plurality of containment walls 355. As illustrated, the upper surface 358 comprises at least one frustum-shaped portion and the frustum-shaped portion is stretched from one wall of the plurality of containment walls 355 to an opposing wall of the plurality of containment walls. The upper surface 358 comprises two frustum-shaped portions. At least one of the plurality of containment walls 355 and the upper surface 358 comprise at least one redirection flow orifice 357. As illustrated, the at least one redirection flow orifice 357 is disposed on opposing sides of the at least one frustum-shaped portion. The heat transfer enhancer 350 forms a pressure enhanced compartment comprising a pressure enhanced region 941 and a boiling region 931 by the upper surface 358, the plurality of containment walls 355, and the directed flow opening 352. The pressure enhanced region 941 is formed near to the upper surface 358. The at least one redirection flow orifice 357 is disposed within the pressure enhanced region 941. The pressure enhanced region 941 is in fluid communication with the boiling region 931.

The directed flow opening 352 of the heat transfer enhancer 350 and bottom surface 112 of the coolant tank 110 form an accelerated flow region 920 therebetween, whereby the boiling region 930 is in fluid communication with the accelerated flow region 920. The at least one of the plurality of containment walls 355 of the heat transfer enhancer 350 and at least one of the plurality of side walls 115 of the coolant tank 110, corresponding to the at least one of the plurality of containment walls 355, form the at least one recycling flow region 910. The at least one recycling flow region 910 is in fluid communication with the accelerated flow region 920.

As shown in FIG. 5B, the heat transfer enhancer 350 illustrates at least a positioning member 359. The positioning member 359 is not shown in FIG. 6A-6C, for clarity of illustration. As illustrated in FIGS. 5A-5B, the positioning member 359 is a plurality of L-shaped supports, positioning the at least one redirection flow orifice 357 of the heat transfer enhancer 350 to not be disposed within the liquid region 900A, positioning the at least one redirection flow orifice 357 of the heat transfer enhancer 350 is at least partially disposed within the liquid region 900B, and positioning the heat transfer enhancer 350 to be completely disposed within the liquid region 900C containing the working fluid, respectively, whereby the pressure enhanced region 940 and the boiling region 930, the accelerated flow region 920, and the at least one recycling flow region 910 are formed.

Figure 7A:
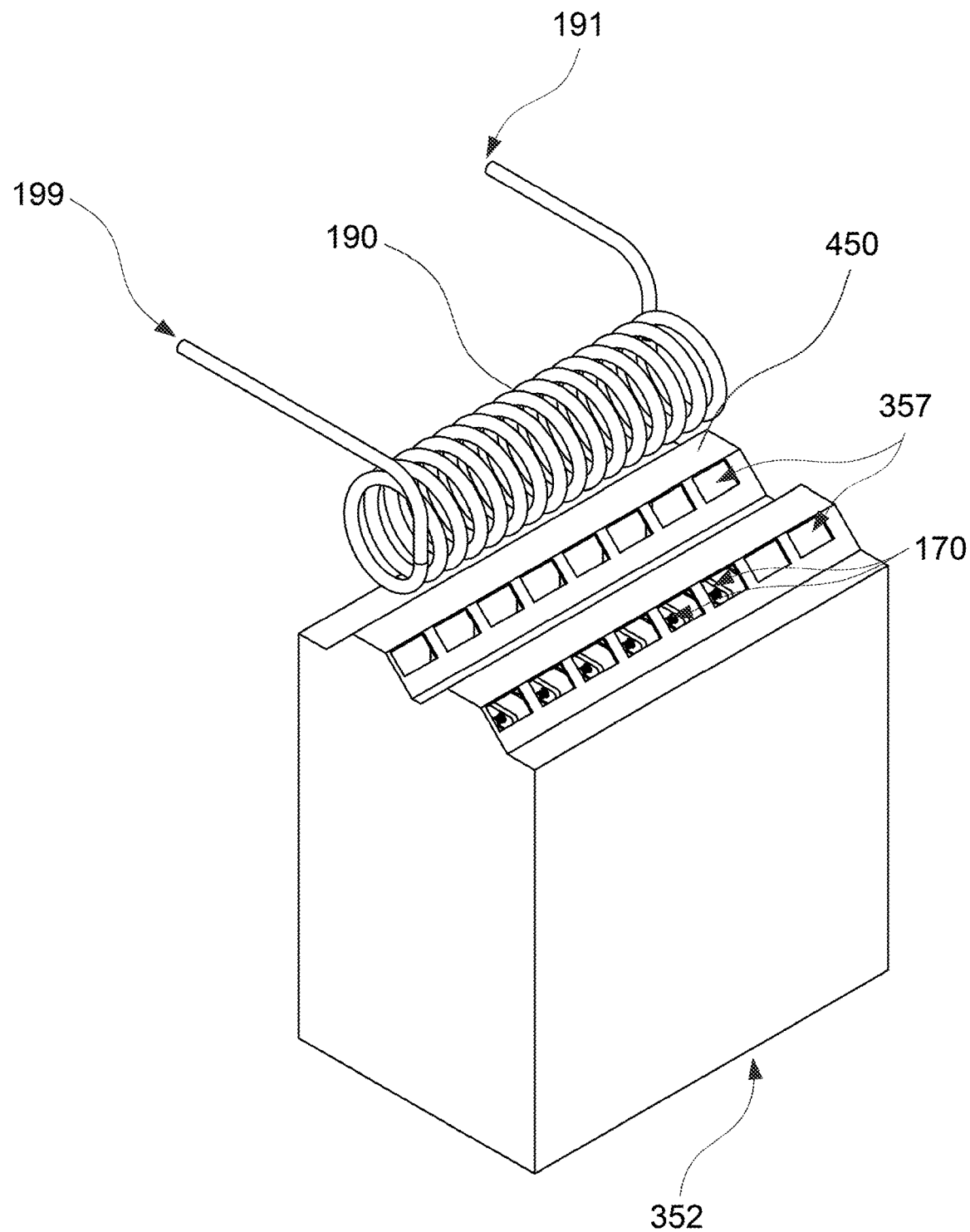
FIG. 7A illustrates a top perspective view of the two-phase immersion cooling apparatus of FIG. 6A, according to disclosed embodiments.

FIG. 7A illustrates a top perspective view of the two-phase immersion cooling apparatus of FIG. 6A, without a cooling tank, according to disclosed embodiments. As illustrated, the at least one condenser 190 comprises thermally conductive condensing coils having condenser working fluid (not shown), an inlet 191, an outlet 199, and an external cooling source (not shown).

In the above embodiments, the coolant tank 110 and the heat transfer enhancer comprise at least one of a carbon steel material, an aluminum material, a stainless steel material, a metal powdered coated material, an aluminum powdered coated material, or a glass material, or any combination of the foregoing.

Figure 7B:
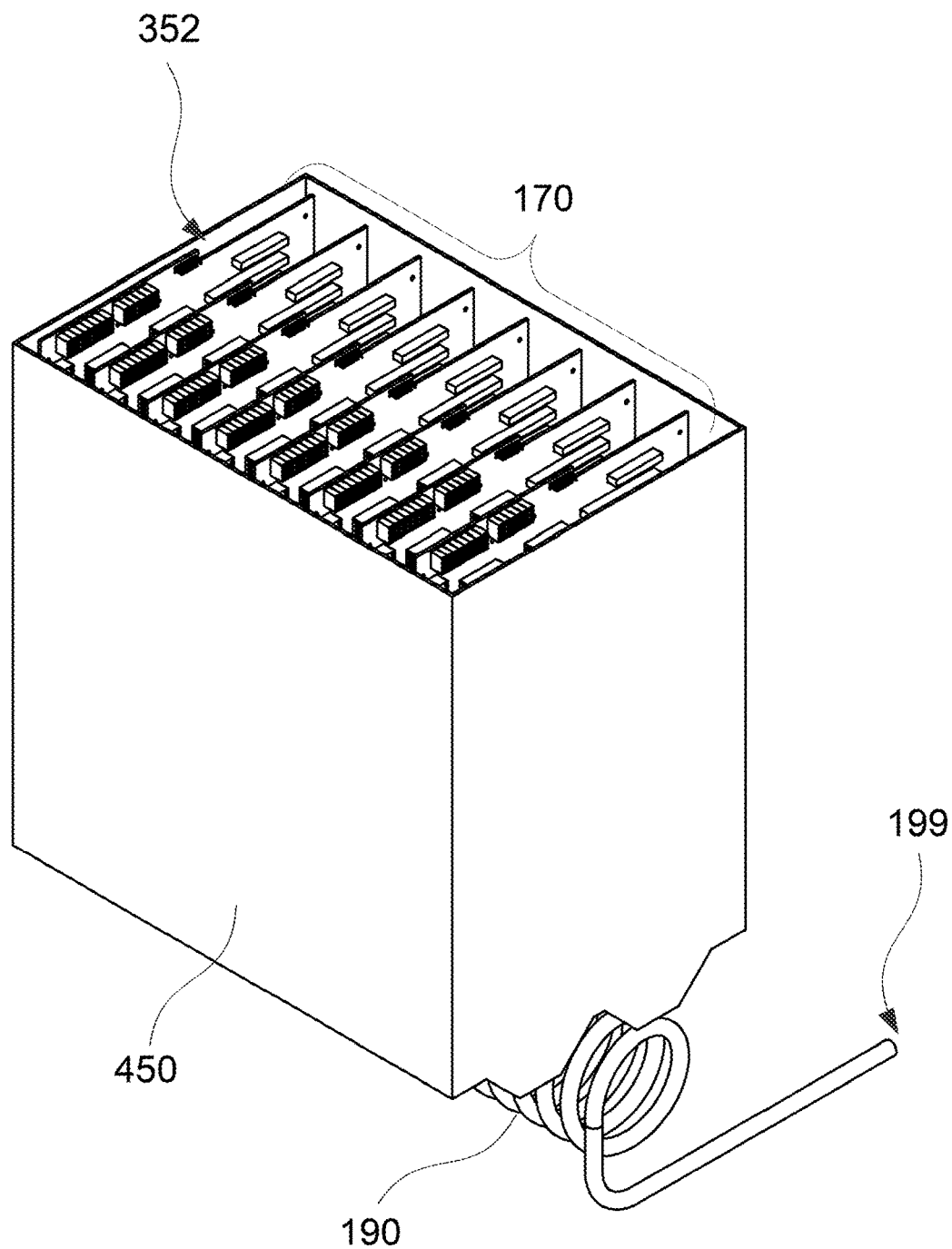
FIG. 7B illustrates a bottom perspective view of the two-phase immersion cooling apparatus of FIG. 6A, according to disclosed embodiments.
Figure 8A:
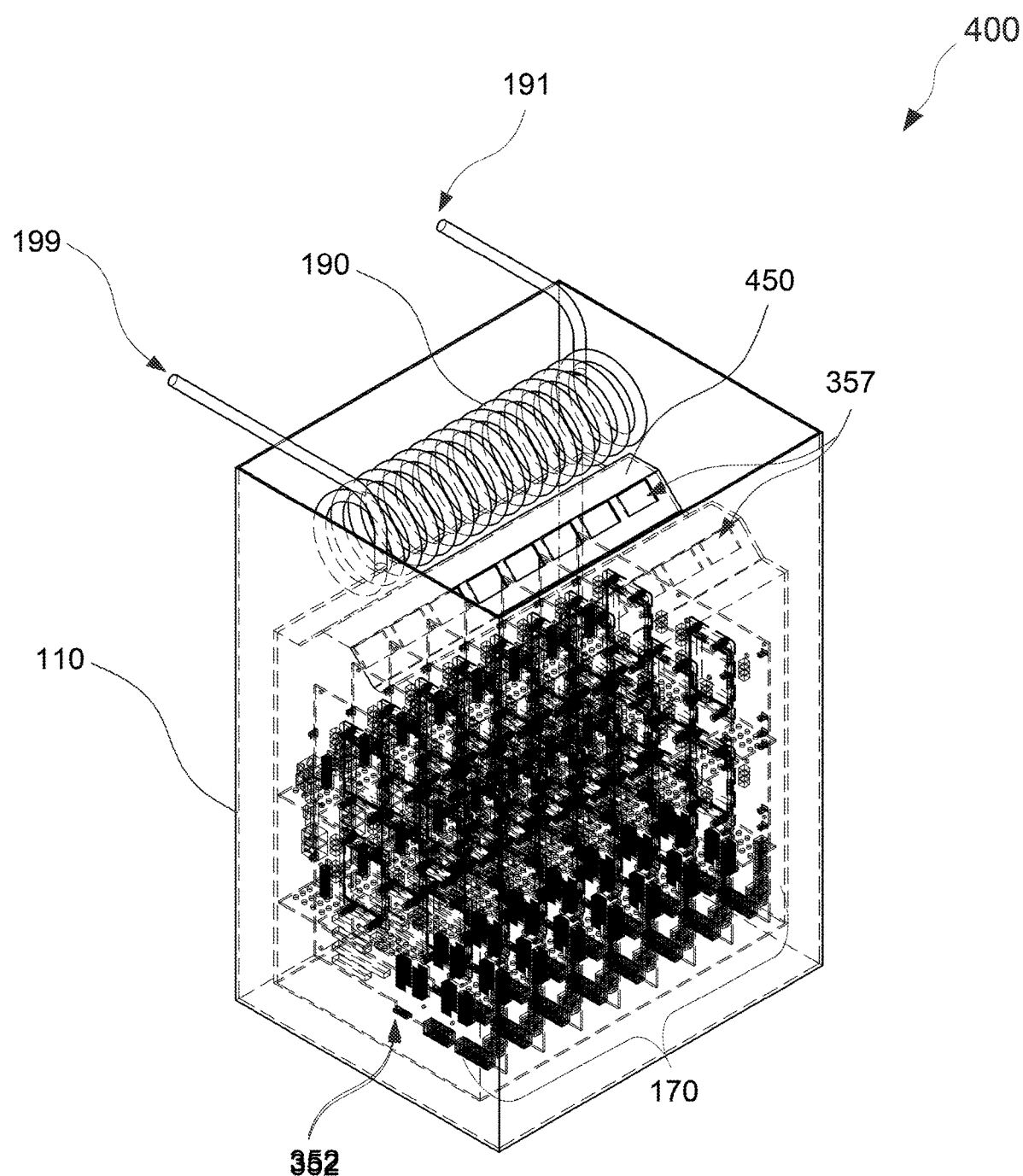
FIG. 8A illustrates a top internal view of the another two-phase immersion cooling apparatus of FIG. 6A, according to disclosed embodiments.
Figure 8B:
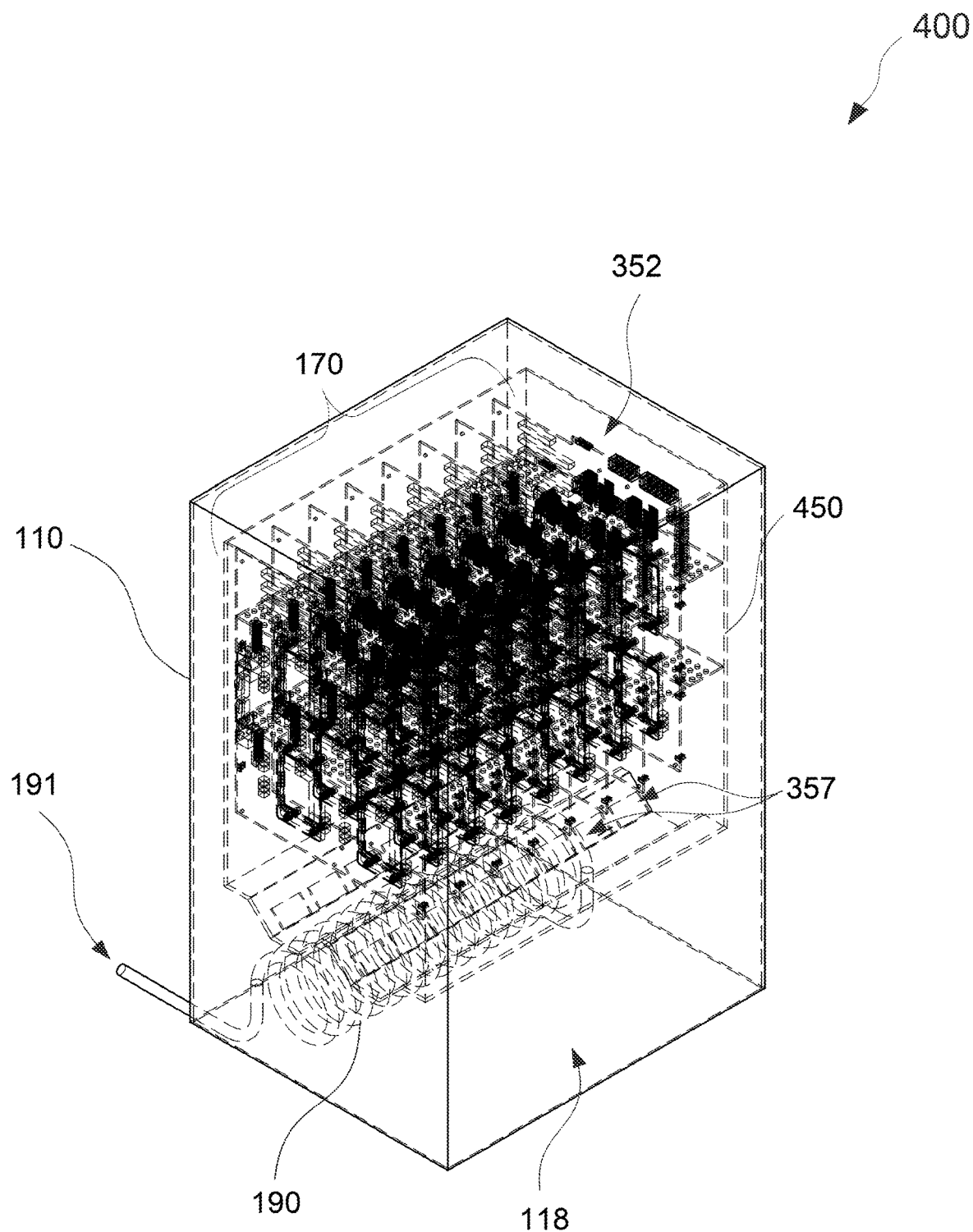
FIG. 8B illustrates a bottom internal view of the another two-phase immersion cooling apparatus of FIG. 6A, according to disclosed embodiments.

FIG. 7B illustrates a bottom perspective view of the two-phase immersion cooling apparatus of FIG. 6A, without a cooling tank, according to disclosed embodiments. FIG. 8A illustrates a top internal view of the another two-phase immersion cooling apparatus of FIG. 6A, according to disclosed embodiments. FIG. 8B illustrates a bottom internal view of the another two-phase immersion cooling apparatus of FIG. 6A, according to disclosed embodiments. As illustrated in FIGS. 7B-8B, and referring again to FIG. 6A-6C, the two-phase immersion cooling apparatus 300, 400 further comprises at least one heat dissipating component 170. The at least one heat dissipating component 170 is configured to be removably mounted to the heat transfer enhancer 350 and is disposed at least partially within the boiling region 930. Portions of the working fluid surrounding the at least one heat dissipating component 170 absorbs sufficient heat from the at least one heat dissipating component 170 to form a plurality of vapor bubbles 935. The plurality of vapor bubbles 935 is redirected to at least one portion of a surface 990A, 990B, 990C of the liquid region 900A, 900B, 900C, respectively, via the at least one redirection flow orifice 357. The at least one redirection flow orifice 357 is configured to collapse the plurality of vapor bubbles passing therethrough. The at least one redirection flow orifice 357 is further configured to form at least one redirection vapor bubble flow channel 950 between the at least one portion of a surface of the liquid region 900B, 900C and the at least one redirection flow orifice 357. The at least one redirection vapor bubble flow channel 950 is in fluid communication with the vapor region 800B, 800C on one end and pressure enhanced region 940 on another end.

In the illustrated embodiments, the at least one heat dissipating component 170 comprises eight printed circuit boards (PCBs) or motherboards, each having four heat dissipating components 170 thereon. It will be understood that more or less than eight printed circuit boards (PCBs) or motherboards may be removably mounted within the heat transfer enhancer 350 and more or less than four heat dissipating components 170 may be mounted to each printed circuit boards (PCBs) or motherboards.

In the illustrated embodiments, the two-phase immersion cooling apparatus 300, 400 of FIGS. 5A-6C may further comprise the at least one heat dissipating component 170 and may initially comprise the at least one heat dissipating component 170 and both may be similar in some respects. It will be understood that all references in the illustrated embodiments of the two-phase immersion cooling apparatus 300, 400, including specific arrangements and examples of coolant tanks 110 and condensers 190 embodying innovative concepts and innovative principles described in relation to selected examples of heat transfer enhancers 350, and redirection flow orifices 357 and well-known functions or constructions, may be applied to the two-phase immersion cooling system further comprising and initially comprising the two-phase immersion cooling apparatus 300, 400.

In the illustrated embodiments, a temperature and a pressure within the enhanced compartment is greater than a temperature and a pressure within the at least one recycling flow region 910. Thus, maximizing heat absorption of the working fluid and enhancing nucleation and growth of the plurality of vapor bubbles 935, and accelerating fluid circulation from the at least one recycling flow region 910 to the boiling region 930 via the accelerated flow region 920.

In the illustrated embodiments, at least one of the at least one redirection flow orifice 357 and/or at least one of the at least one redirection vapor bubble flow channel 950 from at least one of the at least one redirection flow orifice 357 redirects the plurality of vapor bubbles 935 near to the at least one condenser 190. Thus, maximizing dropwise condensation of vapor into liquid 970 back into the liquid region 900A, 900B, 900C containing the working fluid, recycling the working fluid.

In the illustrated embodiments, the location of the at least one condenser 190 at least partially disposed within the vapor region 800A, 800B, 800C and in thermal communication with the vapor region 800A, 800B, 800C, may be configured in order to optimize the flow of vapor phase dielectric fluid and increase the rate and/or efficiency of condensation.

A two-phase immersion cooling apparatus 100, 200, 300, 400 including a coolant tank 110, at least one condenser 190, a heat transfer enhancer 150, 350, and at least one heat dissipating component 170 is provided. Vapor and liquid region 800A-800C and 900A-900C are formed in the coolant tank 110. Pressure enhanced regions 940 and boiling regions 930 are formed in the heat transfer enhancer 150, 350. Accelerated flow and at least one recycling flow region 910 are formed between the heat transfer enhancer 150 and coolant tank 110. The at least one condenser 190 is in thermal communication with the vapor region 800A, 800B, 800C. The pressure enhanced regions 940 and boiling regions 930 and accelerated flow and at least one recycling flow region 910, are in fluid communication thereamong.

In the illustrated embodiments, the at least one redirection flow orifice 157, 357 of the heat transfer enhancer 150, 350 is not disposed within the liquid region 900A, the at least one redirection flow orifice 157, 357 of the heat transfer enhancer 150, 350 is at least partially disposed within the liquid region 900B, and the heat transfer enhancer 150, 350 is completely disposed within the liquid region 900C containing the working fluid. At least one of the plurality of containment walls 155, 355 and the upper surface 158, 358 comprise at least one redirection flow orifice 157, 357. The heat transfer enhancer 150, 350 forms a pressure enhanced compartment comprising the pressure enhanced region 940 and the boiling region 930. The pressure enhanced region 940 is formed near to the upper surface 158, 358. The at least one redirection flow orifice 157, 357 is disposed within the pressure enhanced region 940. As heat is absorbed by the working fluid surrounding the submerged at least one heat dissipating component 170, forming vapor bubbles 935, a temperature and pressure within the pressure enhanced regions 940 and boiling regions 930 is greater than that within the at least one recycling flow region 910. Heat absorption is maximized, enhancing vapor bubble nucleation. As the vapor bubbles 935 depart from the surface of the at least one heat dissipating component 170, fluid motion is increased aiding in the convective heat transfer, which induces an increase of heat flux and heat transfer coefficient. Fluid circulation is accelerated from the at least one recycling flow region 910 having a temperature and pressure less than that within the pressure enhanced regions 940 and boiling regions 930 to the boiling region 930. Evaporation of the working fluid is minimized via the upper surface 158, 358.

In the illustrated embodiments, at least one of the at least one redirection flow orifice 157, 357 and/or at least one of the at least one redirection vapor bubble flow channel 950 from at least one of the at least one redirection flow orifice 157, 357 redirects the plurality of vapor bubbles 935 near to the at least one condenser 190. Thus, maximizing dropwise condensation of vapor into liquid 970 back into the liquid region 900A, 900B, 900C containing the working fluid, recycling the working fluid and further minimizing evaporation of the working fluid.

Therefore, embodiments disclosed herein are well adapted to attain the ends and advantages mentioned as well as those that are inherent therein. The particular embodiments disclosed above are illustrative only, as the embodiments disclosed may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present disclosure. The embodiments illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

What is claimed is:

1. A two-phase immersion cooling apparatus, comprising:
   a coolant tank having an opening, a bottom surface opposite the opening, and a plurality of side walls extending upwardly from a surface perimeter of the bottom surface, defining a liquid region configured to retain a working fluid and a vapor region that is in fluid communication with the liquid region;
   at least one condenser that is at least partially disposed within the vapor region and is in thermal communication with the vapor region; and
   a heat transfer enhancer disposed within the liquid region, the heat transfer enhancer including a directed flow opening, an upper surface opposite the directed flow opening, a plurality of containment walls extending downwardly from a surface perimeter of the upper surface, at least one redirection flow orifice that is positioned on the containment walls or the upper surface, and a pressure enhanced compartment defined by the upper surface, the containment walls and the directed flow opening, where the pressure enhanced compartment includes a boiling region and a pressure enhanced region that is located adjacent to the upper surface and is in fluid communication with the boiling region, and the redirection flow orifice is disposed within the pressure enhanced region, wherein
   an accelerated flow region is formed between the directed flow opening of the heat transfer enhancer and the bottom surface of the coolant tank,
   the boiling region in fluid communication with the accelerated flow region, and
   at least one of the containment walls and a corresponding side wall define at least one recycling flow region that is in fluid communication with the accelerated flow region; and at least one heat dissipating component that is removably mounted to the heat transfer enhancer and at least partially disposed within the boiling region, wherein portions of the working fluid surrounding the at least one heat dissipating component absorbs sufficient heat to form a plurality of vapor bubbles.

2. The two-phase immersion cooling apparatus of claim 1, further comprising the vapor bubbles is redirected to the redirection flow orifice, and the redirection flow orifice collapses the vapor bubbles passing therethrough.

3. The two-phase immersion cooling apparatus of claim 2, wherein the heat dissipating component includes a plurality of modules, each configured to house a specific type of heat generating element, the modules including but not limited to a central processing unit (CPU), a graphic processing unit (GPU), a field programmable gate array (FPGA), an application specific IC (ASIC), and a module with at least one heat generating component that is capable of generating sufficient heat to form a plurality of vapor bubbles within the boiling region.

4. The two-phase immersion cooling apparatus of claim 2, wherein:
   the heat transfer enhancer including at least one of a rack, a frame, or any combination thereof is at least partially positioned within the boiling region,
   the heat dissipating component includes a server that has at least one heat generating component and at least one flow guide plate having at least one opening portion for enabling the working fluid flow to carry heat away from the heat generating component and at least two perforated portions on opposite sides of the opening portion, each perforated portion configured to direct a sub-flow channel to enhance heat transfer efficiency, and
   the server is configured to be removably mounted to the rack, the frame, or any combination thereof.

5. The two-phase immersion cooling apparatus of claim 1, wherein the heat transfer enhancer further includes at least a positioning member configured to position the redirection flow orifice such that the redirection flow orifice is partially disposed within the liquid region and the heat transfer enhancer is completely disposed within the liquid region, thereby forming the pressure enhanced region, the boiling region, the accelerated flow region, and the recycling flow region.

6. The two-phase immersion cooling apparatus of claim 2, wherein the temperature and the pressure within the enhanced compartment are maintained greater than those within the recycling flow region, thereby maximizing heat absorption of the working fluid, enhancing nucleation and growth of the vapor bubbles, and accelerating fluid circulation from the recycling flow region to the boiling region via the accelerated flow region.

7. The two-phase immersion cooling apparatus of claim 2, wherein the redirection flow orifice redirects the vapor bubbles to the condenser, thereby maximizing dropwise condensation of vapor into liquid to return to the liquid region and recycling the working fluid.

8. The two-phase immersion cooling apparatus of claim 1, wherein a shape of the at least one redirection flow orifice is in a quadrilateral shape, and the redirection flow orifice is disposed on at least one of the containment walls.

9. The two-phase immersion cooling apparatus of claim 1, wherein the upper surface includes at least one frustum-shaped portion, and the redirection flow orifice is disposed on at least one side of the frustum-shaped portion.

10. The two-phase immersion cooling apparatus of claim 1, wherein the condenser includes a condenser fluid, an inlet, an outlet, and an external cooling source that is configured to cool the condenser fluid and is in fluid communication with the outlet and the inlet.

11. The two-phase immersion cooling apparatus of claim 1, wherein the coolant tank and the heat transfer enhancer are made of at least one martial including but not limited to carbon steel, aluminum, stainless steel, powder-coated metal, powder-coated aluminum, glass, or any combination thereof.

12. A two-phase immersion cooling apparatus of a two-phase immersion cooling system, comprising:
a coolant tank having an opening, a bottom surface opposite the opening, and a plurality of side walls extending upwardly from a surface perimeter of the bottom surface, defining a liquid region configured to retain a working fluid and a vapor region that is in fluid communication with the liquid region;
at least one condenser that is at least partially disposed within the vapor region and is in thermal communication with the vapor region;
a heat transfer enhancer disposed within the liquid region, the heat transfer enhancer including a directed flow opening, an upper surface opposite the directed flow opening, a plurality of containment walls extending downwardly from a surface perimeter of the upper surface, at least one redirection flow orifice positioned on the containment walls or the upper surface, and a pressure enhanced compartment a pressure enhanced region and a boiling region defined by the upper surface, the containment walls, and the directed flow opening, where the pressure enhanced compartment includes a boiling region and a pressure enhanced region that is located adjacent to the upper surface and is in fluid communication with the boiling region, and the redirection flow orifice is disposed within the pressure enhanced region; and
at least one heat dissipating component that is removably mounted to the heat transfer enhancer and at least partially disposed within the boiling region, where portions of the working fluid surrounding the heat dissipating component absorbs heat to form a plurality of vapor bubbles that is redirected to the at least one redirection flow orifice, and the redirection flow orifice is configured to collapse the plurality of vapor bubbles passing therethrough, wherein
an accelerated flow region is formed between the directed flow opening of the heat transfer enhancer and bottom surface of the coolant tank,
the boiling region in fluid communication with the accelerated flow region, and
at least one of the plurality of containment walls a corresponding side wall define at least one recycling flow region that is in flow region in fluid communication with the accelerated flow region.

13. The two-phase immersion cooling system of claim 12, wherein the at least one heat dissipating component includes a plurality of modules, each configured to house a specific type of heat generating element, the modules including but not limited to a central processing unit (CPU), a graphic processing unit (GPU), a field programmable gate array (FPGA), an application specific IC (ASIC), and a module with at least one heat generating component that is capable of generating sufficient heat to form a plurality of vapor bubbles within the boiling region.

14. The two-phase immersion cooling system of claim 12, wherein:
the heat transfer enhancer including at least one of a rack, a frame, or any combination thereof is at least partially positioned within the boiling region,
the heat dissipating component includes a server that has at least one heat generating component and at least one flow guide plate having at least one opening portion for enabling the working fluid flow to carry heat away from the heat generating component and at least two perforated portions on opposite sides of the opening portion, each perforated portion configured direct a sub-flow channel to enhance heat transfer efficiency, and
the server is configured to be removably mounted to the rack, the frame, or any combination thereof.

15. The two-phase immersion cooling system of claim 12, wherein the heat transfer enhancer further includes at least a positioning member configured to position the redirection flow orifice such that the redirection flow orifice is partially disposed within the liquid region and the heat transfer enhancer is completely disposed within the liquid region containing the working fluid, thereby forming the pressure enhanced region, the boiling region, the accelerated flow region, and the recycling flow region.

16. The two-phase immersion cooling system of claim 12, wherein the temperature and the pressure within the enhanced compartment are maintained greater than those within the recycling flow region, thereby maximizing heat absorption of the working fluid enhancing nucleation and growth of the vapor bubbles, and accelerating fluid circulation from the recycling flow region to the boiling region via the accelerated flow region.

17. The two-phase immersion cooling system of claim 12, wherein the redirection flow orifice redirects the vapor bubbles to the condenser, thereby maximizing dropwise condensation of vapor into liquid to return to the liquid region and recycling the working fluid.

18. The two-phase immersion cooling system of claim 12, wherein a shape of the redirection flow orifice is in a quadrilateral shape, and the redirection flow orifice is disposed on at least one of the plurality containment walls.

19. The two-phase immersion cooling system of claim 12, wherein the upper surface includes at least one frustum-shaped portion, and the redirection flow orifice is disposed on at least one side of the frustum-shaped portion.

20. The two-phase immersion cooling system of claim 12, wherein the at least one condenser includes a condenser fluid, an inlet, an outlet, and an external cooling source that is configured to cool the condenser fluid and is in fluid communication with the outlet and the inlet.

* * * * *